(12) United States Patent
Hwang et al.

(10) Patent No.: US 9,424,928 B2
(45) Date of Patent: Aug. 23, 2016

(54) NONVOLATILE MEMORY DEVICE INCLUDING MULTI-PLANE

(71) Applicant: SAMSUNG ELECTRONICS CO., LTD., Suwon-Si, Gyeonggi-Do (KR)

(72) Inventors: Chul-Jin Hwang, Seongnam-Si (KR); Pansuk Kwak, Seoul (KR); Younghwan Ryu, Seongnam-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/817,281

(22) Filed: Aug. 4, 2015

(65) Prior Publication Data

US 2016/0163386 A1 Jun. 9, 2016

(30) Foreign Application Priority Data

Dec. 8, 2014 (KR) .......................... 10-2014-0175045

(51) Int. Cl.
*G11C 16/04* (2006.01)
*G11C 16/08* (2006.01)
*G11C 16/26* (2006.01)

(52) U.S. Cl.
CPC ............ *G11C 16/08* (2013.01); *G11C 16/0483* (2013.01); *G11C 16/26* (2013.01)

(58) Field of Classification Search
CPC ........... G11C 16/107; G11C 8/00; G11C 8/16
USPC ........................................ 365/185.27, 185.11
See application file for complete search history.

(56) References Cited

U.S. PATENT DOCUMENTS

| | | | |
|---|---|---|---|
| 6,385,074 B1 | 5/2002 | Johnson et al. | |
| 7,679,133 B2 | 3/2010 | Son et al. | |
| 7,889,538 B2 | 2/2011 | Toda | |
| 7,949,819 B2 | 5/2011 | Kang et al. | |
| 8,258,496 B2 | 9/2012 | Toda et al. | |
| 8,553,466 B2 | 10/2013 | Han et al. | |
| 8,559,235 B2 | 10/2013 | Yoon et al. | |
| 8,593,869 B2 | 11/2013 | Tanzawa | |
| 8,611,121 B2 | 12/2013 | Ahn et al. | |
| 8,654,587 B2 | 2/2014 | Yoon et al. | |
| 8,717,804 B2 | 5/2014 | Toda | |
| 8,792,263 B2 | 7/2014 | Tanzawa | |
| 8,824,183 B2 | 9/2014 | Samachisa et al. | |
| 2010/0214838 A1* | 8/2010 | Hishida ............... | G11C 8/08 365/185.11 |
| 2011/0233648 A1 | 9/2011 | Seol et al. | |
| 2012/0032250 A1* | 2/2012 | Son ................... | H01L 21/28273 257/324 |
| 2012/0069664 A1* | 3/2012 | Kim ................... | G11C 16/0483 365/185.11 |
| 2012/0147651 A1 | 6/2012 | Scheuerlein et al. | |
| 2013/0130495 A1 | 5/2013 | Higashitani et al. | |
| 2013/0262751 A1* | 10/2013 | Kwak ................ | G11C 16/3495 711/103 |
| 2014/0085979 A1 | 3/2014 | Kono | |
| 2014/0097519 A1 | 4/2014 | Cho et al. | |
| 2014/0198552 A1 | 7/2014 | Park et al. | |

FOREIGN PATENT DOCUMENTS

KR 101027349 B1 3/2011

* cited by examiner

*Primary Examiner* — Han Yang
(74) *Attorney, Agent, or Firm* — Volentine & Whitt, PLLC

(57) ABSTRACT

A nonvolatile memory device includes a memory cell array including cell strings stacked in a direction orthogonal to a substrate and including a first substring group and a second substring group dividing the cell strings, and an address decoder connected to memory cells of the cell strings via a plurality of word lines and configured to provide operating voltages to the memory cells, wherein the address decoder is disposed between the first substring group and second substring group.

28 Claims, 19 Drawing Sheets

NONVOLATILE MEMORY DEVICE INCLUDING MULTI-PLANE

CROSS-REFERENCE TO RELATED APPLICATION

This U.S. non-provisional patent application claims priority under 35 USC §119 to Korean Patent Application No. 10-2014-0175045 filed on Dec. 8, 2014, the subject matter of which is hereby incorporated by reference herein.

BACKGROUND

The inventive concept relates generally semiconductor memory devices. More particularly, the inventive concept relates to nonvolatile memory devices including multiple planes.

Semiconductor memory devices may be embodied using one or more semiconductor material including silicon (Si), germanium (Ge), gallium arsenide (GaAs), and indium phosphide (InP). Semiconductor memory devices may be classified as volatile and nonvolatile memory devices.

Volatile memory devices such as the Dynamic Random Access Memory (DRAM) and Static RAM (SRAM) lose stored data in the absence of applied power. In contrast, nonvolatile memory devices, such as the Electrically Erasable Programmable Read Only Memory (EEPROM) including flash memory, Ferromagnetic RAM (FRAM), Phase-change RAM (PRAM), and Magnetic RAM (MRAM), etc. Flash memory may be further classified as NOR type and NAND type.

Ongoing efforts to provide very dense memory cell integration per unit area of memory device have motivated research into nonvolatile semiconductor device configurations that include one or more three-dimensional (3D) structures. Some of these structures include so-called Cell Over Peri or COP structures in which a peripheral circuit is disposed in a material plane between another plane including a memory cell array and the underlying substrate. Hence, a COP structure may be used to integrate relatively more memory cells per unit area of the constituent semiconductor memory device by placing one or more peripheral circuit(s) adjacent to one or more of the four (4) sides of the memory cell area between the memory cell plane and the substrate.

SUMMARY

Embodiments of the inventive concept provide a nonvolatile memory devices including a COP (Cell On Peri) structure within a 3D or and multi-plane configuration.

In one embodiment, the inventive concept provides a nonvolatile memory device comprising a first plane formed on a first semiconductor layer, the first plane configured to include a first cell strings formed in a first direction orthogonal to the first semiconductor layer, a second plane formed on a second semiconductor layer, the second plane configured to include a second cell strings formed in the first direction, a first decoder configured to supply a first operation voltages to the first plane, a second decoder configured to supply a second operation voltages to the second plane, a first peripheral circuit disposed between a substrate and the first semiconductor layer, the first peripheral circuit configured to control the first decoder; and a second peripheral circuit disposed between the substrate and the second semiconductor layer, the second peripheral circuit configured to control the second decoder, wherein the first peripheral circuit and the second peripheral circuit are connected via a peripheral conductive layer disposed under the first semiconductor layer and the second semiconductor layer.

The nonvolatile memory device further comprises a first page buffer circuit configured to program the first cell strings, the first page buffer circuit configured to read data from the first cell strings, a second page buffer circuit configured to program the second cell strings, the second page buffer circuit configured to read data from the second cell strings, the first page buffer circuit arranged adjacent to the first peripheral circuit on the substrate, the second page buffer circuit arranged adjacent to the second peripheral circuit on the substrate. The first page buffer circuit is connected to a first page buffer line disposed under the semiconductor layer via a first page buffer contact, the first page buffer line is connected to a first bit lines connected to the first cell strings through a page buffer via penetrated the semiconductor layer. The first page buffer line is connect to a second page buffer line disposed under the semiconductor layer via the second page buffer contact, the second page buffer line is connected to the first bit lines through the page buffer via.

The first page buffer circuit is disposed under the first plane, the second page buffer circuit is disposed under the second plane. The first page buffer circuit comprises a first sub-buffer group and a second sub-buffer group, the first peripheral circuit is disposed between the first sub-buffer group and the second sub-buffer group.

The nonvolatile memory device comprises a first page buffer circuit configured to program the first cell strings, the first page buffer circuit configured to read data from the first cell strings, a second page buffer circuit configured to program the second cell strings, the second page buffer circuit configured to read data from the second cell strings, the first page buffer circuit is disposed under the first plane and adjacent to a longitudinal section of the first plane, the first page buffer circuit is connect to the first cell strings via a first bit lines, the second page buffer circuit is disposed under the second plane and adjacent to a longitudinal section of the second plane, the second page buffer circuit is connect to the second cell strings via a second bit lines.

The first plane and the second plane are disposed adjacent to each other, the first decoder is arranged, around the first plane, on the opposite side of the second plane, the second decoder is arranged, around the second plane, on the opposite side of the first plane. The nonvolatile memory device further comprises an I/O pad is formed along a surface orthogonal to a surface adjacent to the first plane and the second plane, the I/O pad is configured to transmit and receive a command and address from an external device. The first peripheral circuit comprises a first decoder controller to control the first decoder. The second peripheral circuit comprises a second decoder controller to control the second decoder. The first decoder controller is disposed adjacent to the first decoder. The second decoder controller is disposed adjacent to the second decoder.

The first peripheral circuit and second peripheral circuit comprise a voltage generator configured to generate the first operation voltage and the second operation voltage, the voltage generator configured to supply the first and second operation voltage to the first and the second decoder, and a control logic configured to control the voltage generator and the first and second decoder.

The first peripheral circuit and second peripheral circuit comprise an I/O circuit configured to receive a command, address, and write data from an external device, the I/O circuit configured to transmit the command to the control logic, the I/O circuit configured to transmit the address to the first decoder and the second decoder according to a control of the control logic, the I/O circuit configured to transmit the write data to the first plane, the second plane, and a first page buffer and a second page buffer via a plurality of bit lines according to a control of the control logic.

The first and the second page buffer circuit configured to read data from the first and second plane according to a control of the control logic, the I/O circuit configured to transmit the data read from the first and second plane according to a control of the control logic. The control logic is disposed between the voltage generator and the I/O circuit. The voltage generator and the I/O circuit are disposed adjacent to each other, the control logic is arranged adjacent to a surface orthogonal a surface adjacent to the voltage generator and the I/O circuit.

The peripheral conductive layer comprises a first peripheral conductive line connected to an active region formed on the substrate via a first peripheral contact, a second peripheral conductive line connected to the first peripheral conductive line via a second peripheral contact, a third peripheral conductive line connected to the second peripheral conductive line via a third peripheral contact, the first and second peripheral circuit are connected each other via the third peripheral conductive line.

An active region of at least one transistor included in the first peripheral circuit is connected to a gate region of at least one transistor included in the second peripheral circuit via the first through third contact and the first through third peripheral conductive line. The first decoder is connect to the first cell string via a first word line, the second decoder is connected the second cell string via a second word line, each of the first and second word line is connected to the a decoder conductive layer formed on the first and second decoder through a decoder via.

In another embodiment, the inventive concept provides A nonvolatile memory device comprising a first plane including a first cell strings formed on a first semiconductor layer in a first direction orthogonal to the first semiconductor layer, the first plane including a first and second substring group dividing the first cell strings, a second plane including a second cell strings form in the first direction on a second semiconductor layer, the second plane including a third and forth sub string group dividing the second cell strings, a first decoder disposed between the first and second sub string group, the first decoder configured to supply a first operation voltages to the first plane, a second decoder disposed between the third and forth substring group, the second decoder configured to supply a second operation voltages to the second plane, a first peripheral circuit disposed between a substrate and the first plane, the first peripheral circuit configured to control the first decoder; and a second peripheral circuit disposed between the substrate and the second plane, the second peripheral circuit configured to control the second decoder, the first peripheral circuit and the second peripheral circuit are connected each other via a peripheral metal layer disposed under the first and second semiconductor layer.

The second substring group is disposed adjacent to the third substring group, the first peripheral circuit is disposed under the second substring, the second peripheral circuit is disposed under the third substring group. A first memory cells of the first and second substring group are formed on a first height from the first semiconductor layer, the first memory cells are connected to a first word line, a second memory cells of the first and second substring group are formed on a second height from the first semiconductor layer, the second memory cells are connect to a second word line, the first and second word line are connected to different transistor each other included in the first decoder.

In another embodiments, the inventive concept provides a nonvolatile memory device comprising a first plane including a first cell strings formed on a first semiconductor layer in a first direction orthogonal to the first semiconductor layer, the first plane including a first and second substring group dividing the first cell strings, a second plane including a second cell strings form in the first direction on a second semiconductor layer, the second plane including a third and forth substring group dividing the second cell strings, a first decoder disposed between the first and second sub string group, the first decoder configured to supply a first operation voltages to the first plane, a second decoder disposed between the third and forth substring group, the second decoder configured to supply a second operation voltages to the second plane, a first peripheral circuit disposed between a substrate and the first plane, the first peripheral circuit configured to control the first decoder; and a second peripheral circuit disposed between the substrate and the second plane, the second peripheral circuit configured to control the second decoder, the first peripheral circuit and the second peripheral circuit are connected each other via a peripheral metal layer disposed under the first and second semiconductor layer.

The second substring group is disposed adjacent to the third substring group, the first peripheral circuit is disposed under the second substring, the second peripheral circuit is disposed under the third substring group. a first memory cells of the first and second substring group are formed on a first height from the first semiconductor layer, the first memory cells are connected to a first word line, a second memory cells of the first and second substring group are formed on a second height from the first semiconductor layer, the second memory cells are connect to a second word line, the first and second word line are connected to different transistor each other included in the first decoder. The first word line is connected to a first sub-decoder of the first decoder through a first decoder via, the second word line is connected to a second sub-decoder of the first decoder through a second decoder via.

In another embodiment, the inventive concept provides a nonvolatile memory device comprising a memory cell array including cell strings stacked in orthogonal direction to the a substrate, the memory cell array including a first and a second substring group dividing the cell strings; and an address decoder connected to memory cells of the cell strings via a plurality of word lines, the address decoder configured to supply operation voltages to the memory cells, the address decoder disposed between the first and the second substring group. The nonvolatile memory device wherein a first memory cells of the first and the second substring group formed on a first height from the substrate, the first memory cells is connected to a first word line, a second memory cells of the first and the second sub string group formed on a second height from the substrate, the second memory cells is connected to a second word line, the first and the second word line are connected to different transistor each other included in the address decoder. The first word line is connected to a first sub-decoder included in the address decoder, the second word line is connected to a second sub-decoder included in the address decoder. The first word line is connected to the first sub-decoder through a first decoder via, the second word line is connected to the second sub-decoder through a second decoder via.

BRIEF DESCRIPTION OF THE DRAWINGS

The above and other features and advantages of the inventive concept will become more apparent upon consideration of certain embodiments of the illustrated in the accompanying drawings.

DETAILED DESCRIPTION

Figure 1:
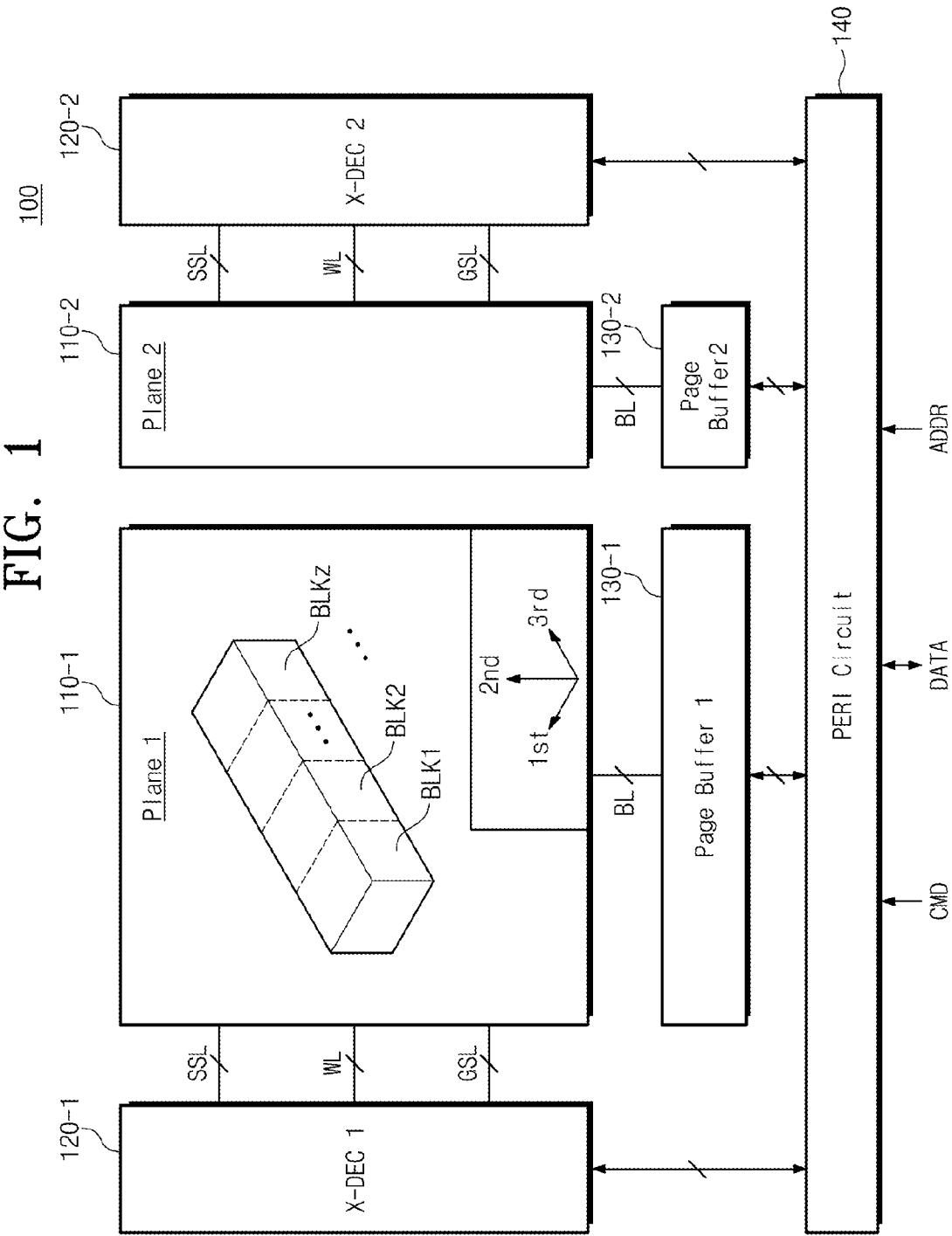
FIG. 1 is a block diagram illustrating a nonvolatile memory device including multi-plane according to embodiments of the inventive concepts.

Certain embodiments of the inventive concept will now be described with reference to the accompanying drawings. However, the inventive concept may be variously embodied and should not be construed as being limited to only the illustrated embodiments. Throughout the written description and drawings, like reference numbers denote like or similar elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. As used herein, the term "and/or" includes any and all combinations of one or more of the associated listed items.

Unless otherwise defined, all terms, including technical and scientific terms, used herein have the same meaning as commonly understood by one of ordinary skill in the art to which example embodiments of the inventive concept belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Certain embodiments of the inventive concept include a three-dimensional (3D) memory array. The 3D memory array is monolithically formed in one or more physical levels (or planes) including an active area disposed above a silicon substrate and circuitry associated with the operation of those memory cells, whether such associated circuitry is above, below or within such substrate. The term "monolithic" means that layers of each level of the array are directly deposited on the layers of each underlying level of the array.

Relative dispositional terms such as above, below, lateral, vertical, adjacent, under, over, beneath, beside, height, etc. are used herein to described certain embodiments of the inventive concept in view of the accompanying drawings. Those skilled in the art will understand that these terms are arbitrary in nature and use and are meant to described exemplary and relative element, level, and planar relationships.

In certain embodiments of the inventive concept, a 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235, and published U.S. Patent Application No. 2011/0233648.

Figure (FIG. 1 is a block diagram illustrating a nonvolatile memory device including multi-plane according to embodiments of the inventive concept. Referring to FIG. 1, the nonvolatile memory device 100 includes a first plane 110-1, a second plane 110-2, a first address decoder 120-1, a second address decoder 120-2, a first page buffer circuit 130-1, a second page buffer circuit 130-2, and a peripheral (PERI) circuit 140.

The first plane 110-1 and second plane 110-2 may include a plurality of memory blocks (BLK1~BLKz, where 'z' is an integer greater than 1). The memory blocks BLK1~BLKz may be connected to an address decoder (120-1 or 120-2) via word lines (WL), at least one of string select line (SSL) and at least one of ground select line (GSL). The memory blocks (BLK1~BLKz) may be connected to the page buffer circuit (130-1 or 130-2) via the bit lines (BL).

The memory blocks BLK1~BLKz may be arranged in arbitrarily defined first, second and third directions relative to a semiconductor layer or substrate. The memory blocks BLK1~BLKz may include a plurality of strings arranged with the 3-dimensional structure in the second direction substantially orthogonal to a first direction associated with the semiconductor layer or substrate. Herein, each of the plurality of strings includes a series arrangement of at least one of string select transistor, a plurality of memory cells, and at least one of ground select transistor. Each of the plurality of memory cells may be a single-level memory cell (SLC) configured to store one data bit per memory cell, or a multi-level memory cell (MLC) configured to store 2 or more data bits per memory cell. In each string, one or more dummy cells may be included between a string select transistor and the memory cells, and/or between the memory cells and a ground select transistor.

The first address decoder 120-1 and second address decoder 120-2 may be configured to select at least one of memory blocks (BLK1~BLKz) in response to an address. The first address decoder 120-1 and second address decoder 120-2 may be connected to each of planes (110-1, 110-2) via word lines, and at least one string select line and/or at least one ground select line. The first address decoder 120-1 and second address decoder 120-2 may select the word lines, the string select line, and the ground select line using a decoded row address. The first and second address decoders (120-1, 120-2) may decode a column address among received address. The decoded column address may then be transmitted to one or more page buffer circuits (130-1 or 130-2). For example, the first and second address decoders (120-1, 120-2) may include row decoder, column decoder, and address buffer.

The first buffer circuit 130-1 and second buffer circuit 130-2 may be connected to corresponding plane (110-1 or 110-2) via the bit lines. For example, the first page buffer 130-1 may be connected to the first plane 110-1, and the second page buffer circuit 130-2 may be connected to the second plane 110-2. The first page buffer circuit 130-1 may be embodied to receive the decoded column address from the first address decoder 120-1. The second page buffer circuit 130-2 may be embodied to receive the decoded column address from the second address decoder 120-2. The first and the second page buffer circuits (130-1, 130-2) may select the bit lines using the decoded column address.

The first and the second page buffer circuits (130-1, 130-2) may receive data from external device (e.g., a memory controller). The first and the second page buffer circuits (130-1, 130-2) may store the received data to the corresponding plane (110-1 or 110-2). The first and the second page buffer circuits 130-1, 130-2 may read data from the corresponding planes (110-1 or 110-2) and transmit the read data to the external device.

The peripheral circuit 140 may include an input/output (I/O) circuit, a voltage generator and the control logic, where the I/O circuit is connected to the first and second address decoders (120-1, 120-2) as well as the first and second page buffer circuit (130-1, 130-2). The I/O circuit may include a global buffer to store command (CMD), address (ADDR), and data (DATA) received from the memory controller. The first and the second page buffer circuits (130-1, 130-2) may share at least one global buffer included in the I/O circuit.

The voltage generator may be used to generate a variety of voltages as needed to perform various operations in the nonvolatile memory device 100. For example, the voltage generator may be used to generate one or more program voltage(s), pass voltage(s), read voltage(s), select voltage(s), non-select voltage(s), etc.

The control logic may be connected to the first and second address decoders (120-1, 120-2), the voltage generator, and I/O circuit. The control logic may be used to control the overall operation of the nonvolatile memory device 100 in response to one or more command(s)/address(es)/data received from the memory controller.

Figure 2:
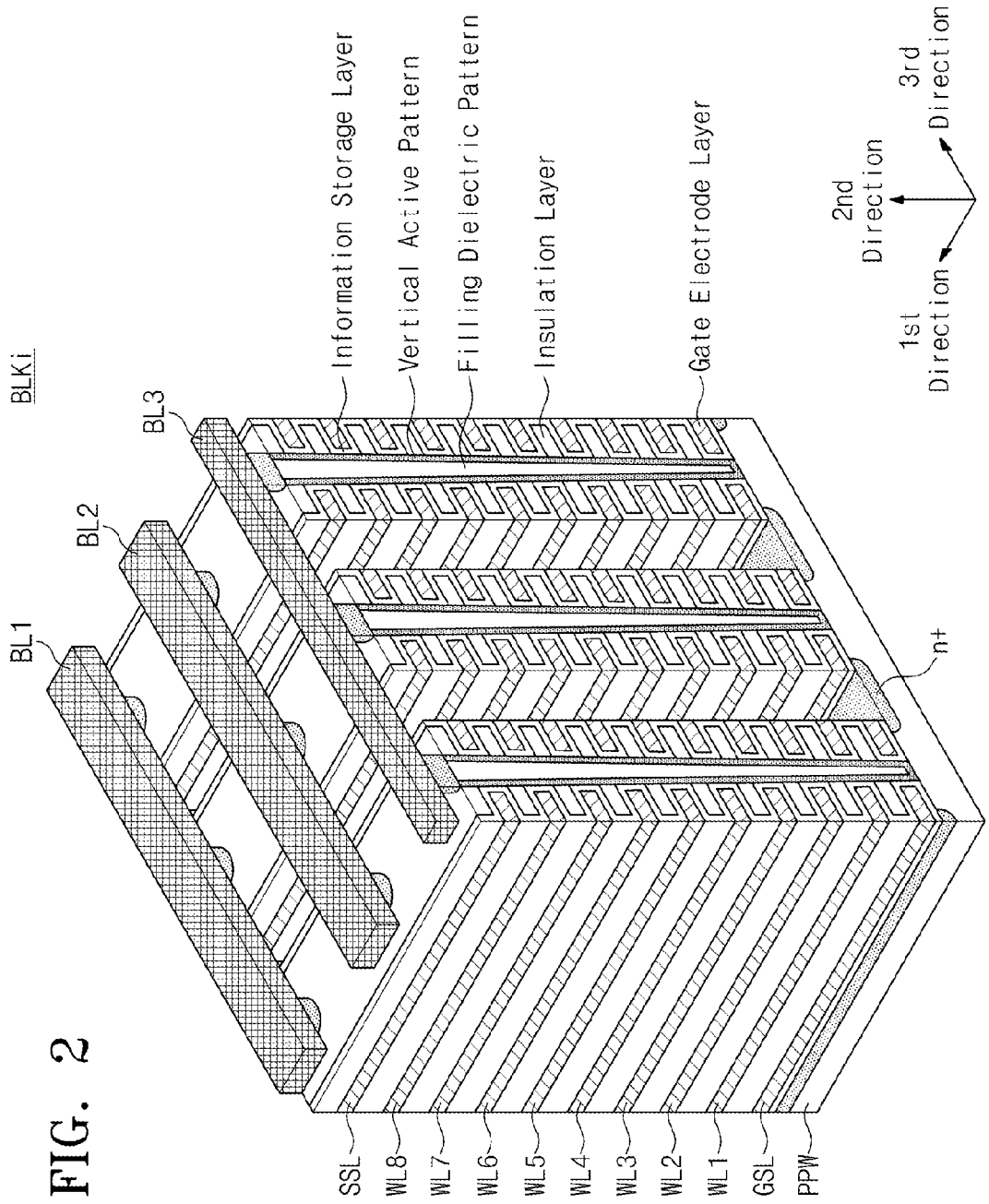
FIG. 2 is a perspective view illustrating one of memory blocks (BLKi) of FIG. 1 according to embodiments of the inventive concepts.

FIG. 2 is a perspective view illustrating one of memory blocks (BLKi) of FIG. 1. Referring to the FIG. 2, the memory block BLKi may be formed in the second direction substantially orthogonal to a designated semiconductor layer PPW. The semiconductor layer PPW may be formed of one or more P-type semiconductor materials. However, the semiconductor layer PPW is not limited thereto. Here, however, it is assumed that the semiconductor layer PPW is embodied by a P-type semiconductor. Accordingly, a n+ doping region may be formed in the first direction in the semiconductor layer PPW to form a pocket well.

A gate electrode layer and an insulation layer are then sequentially deposited on the semiconductor layer PPW. A charge storage layer is disposed between the gate electrode layer and the insulation layer.

If the gate electrode layer and the insulation layer are patterned in a vertical direction, a V-shaped pillar is formed. The pillar may thus be connected with the semiconductor layer PPW via the gate electrode layer and the insulation layer. An inner portion of the pillar may be a filling dielectric pattern such as a silicon oxide, and be formed an insulation material. An outer portion of the pillar may be a vertical active pattern, and be formed an channel semiconductor.

The gate electrode layer of the memory block BLK1 is connected to a ground selection line GSL, a plurality of word lines WL1 to WL8, and a string selection line SSL. In this manner, the pillar of the memory block BLKi is connected with a plurality of bit lines BL1 to BL3.

In FIG. 2, there is exemplarily illustrated a case in which one memory block BLKi includes two (2) ground/string selection lines and eight (8) word lines WL1 to WL8. However, those skilled in the art will understand that embodiments of the inventive concept may include many different signal line definitions.

Figure 3:
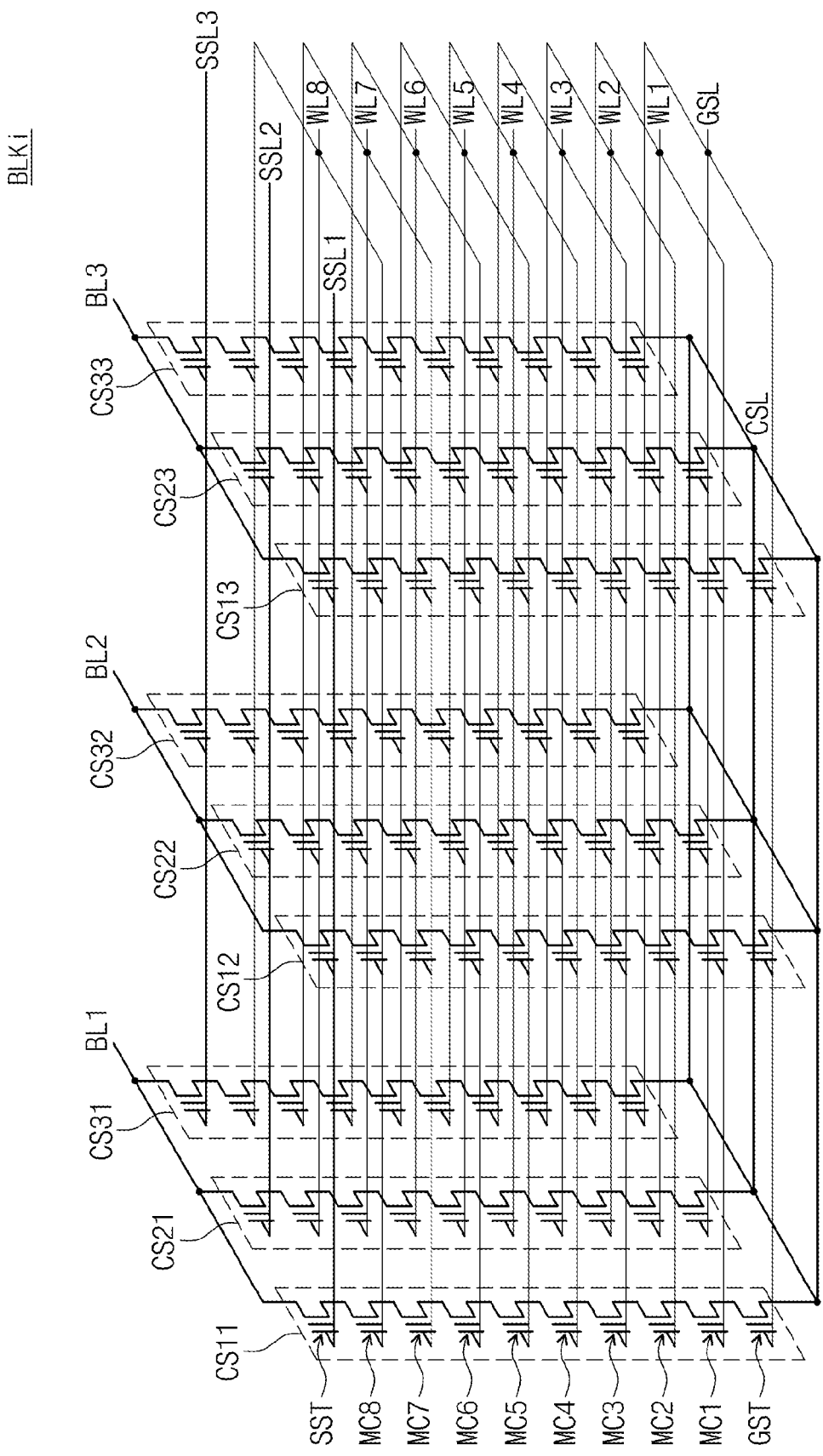
FIG. 3 is a diagram illustrating an equivalent circuit of memory block (BLKi) of FIG. 2 according to embodiments of the inventive concept.

FIG. 3 is a partial, equivalent circuit diagram further illustrating the memory block (BLKi) of FIG. 2 according to embodiments of the inventive concept. Referring to the FIG. 3, cell strings CS11~CS33, between bit lines BL1~BL3 and common source line CSL, are connected. Each of the cell string (for example, CS11) may include a ground selection transistor GST, a plurality of memory cells (MC1~MC8), and string selection transistor SST.

The string selection transistor SST may be connected to the string selection line SSL. The string selection line SSL may be separated into a first string selection line SSL1, a second string selection line SSL2, a third string selection line SSL3. FIG. 3 is a diagram illustrating regarding to 3 string selection lines SSL1~SSL3 corresponding one bit line. However, embodiments of the inventive concept may be not limited hereto. The memory block BLKi of inventive concept may be composed with at least two string selection lines corresponding to a bit line.

The ground selection transistor GST may be connected to the ground selection line GSL. Each of ground selection line GSL of cell strings is connected each other. The string selection transistor SST may be connect to the bit line. The ground selection transistor GSL may be connected to the common source line CSL. The memory block BLKi of FIG. 3 is a structure sharing the ground selection line. However, embodiments of the inventive concept may be not limited hereto. The ground selection line GSL of the inventive concept may be embodied separated structure such as the string selection lines SSL1~SSL3.

A plurality of memory cell MC1~MC8 may be connected to each corresponding word lines WL1~WL8. That is a "page" of memory cells may be defined as a set of memory cells connected one word line and programmed concurrently. The memory block BLKi may be composed of many pages, where a word line may be connected to one or more page(s). Referring to FIG. 3, same "height" word line (e.g., WL4) from the common source line CSL may be connected to three (3) pages.

As previously noted each memory cell may be SLC or MLC. Assuming the use of 2-bit MLC, one (1) physical page of data may store two (2) pages of data. Therefore, extending the working example, the memory cells connected to the forth word line WL4 in FIG. 3 may store up to six (6) pages of data.

The nonvolatile memory device 100 may be embodied charge trap flash (CTF). Initial verify shift (IVS) may occurred, and as a result, electrons trapped at programmed CTF are redistributed and/or carried away. To overcome this threshold distribution degradation phenomenon, reprogramming may be performed.

Figure 4:
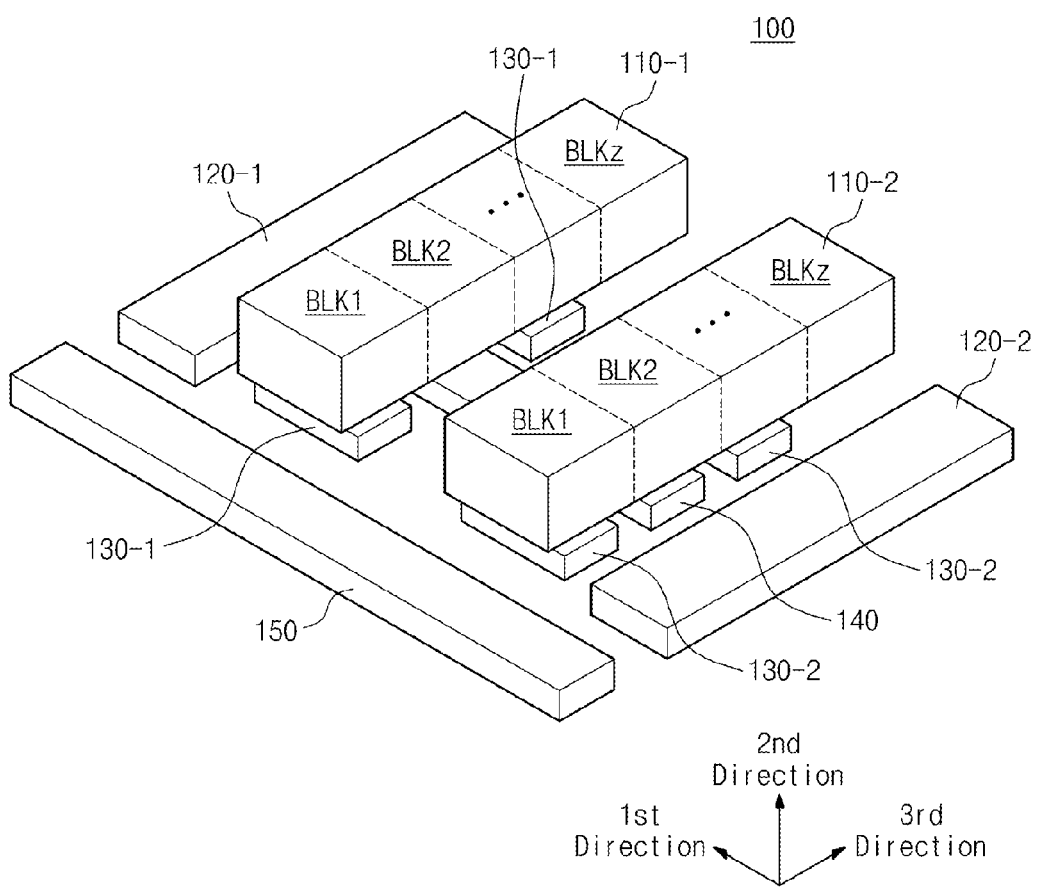
FIG. 4 is a perspective view illustrating nonvolatile memory device of FIG. 1 according to embodiments of the inventive concept.

FIG. 4 is a perspective diagram further illustrating the nonvolatile memory device 100 of FIG. 1. Referring FIG. 4, the nonvolatile memory device 100 is assumed to have a COP structure. Therefore, the first and second page buffer circuit (130-1, 130-2) and the peripheral circuit 140 are disposed between the substrate and the first and second plane (110-1, 110-2).

The peripheral circuit 140 may be arranged in the first direction on the substrate, and the first and second page buffer circuit (130-1, 130-2) may be arranged in parallel with the peripheral circuit 140 and respectively on both side of the peripheral circuit 140. Hence, the first address decoder 120-1 may be arranged in the third direction on one side of the first page buffer circuit 130-1, and the second address decoder 120-2 may be arranged in the third direction on the side of the second page buffer circuit 130-2. The first address decoder 120-1 and second address decoder 120-2 may be arranged on opposite sides of the peripheral circuit 140. An Input/Output (I/O) pad 150 may be arranged on the side of the first and second page buffer (130-1, 130-2) in the first direction, where the I/O pad 150 is connected to the first and second page buffer circuits (130-1, 130-2) and peripheral circuit 140 via appropriate wiring (not shown).

The first and second planes (110-1, 110-2) may be arranged above the first and second page buffer circuits (130-1, 130-2) and peripheral circuit 140. For example, a first semiconductor layer may be stacked on the first page buffer circuit 130-1 and peripheral circuit 140. The first plane 110-1 may then be stacked on the first semiconductor layer in the second direction. A second semiconductor layer may be stacked on the second page buffer circuit 130-2 and peripheral circuit 140. The second plane 110-2 may be stacked on the second semiconductor layer in the second direction.

Figure 5:
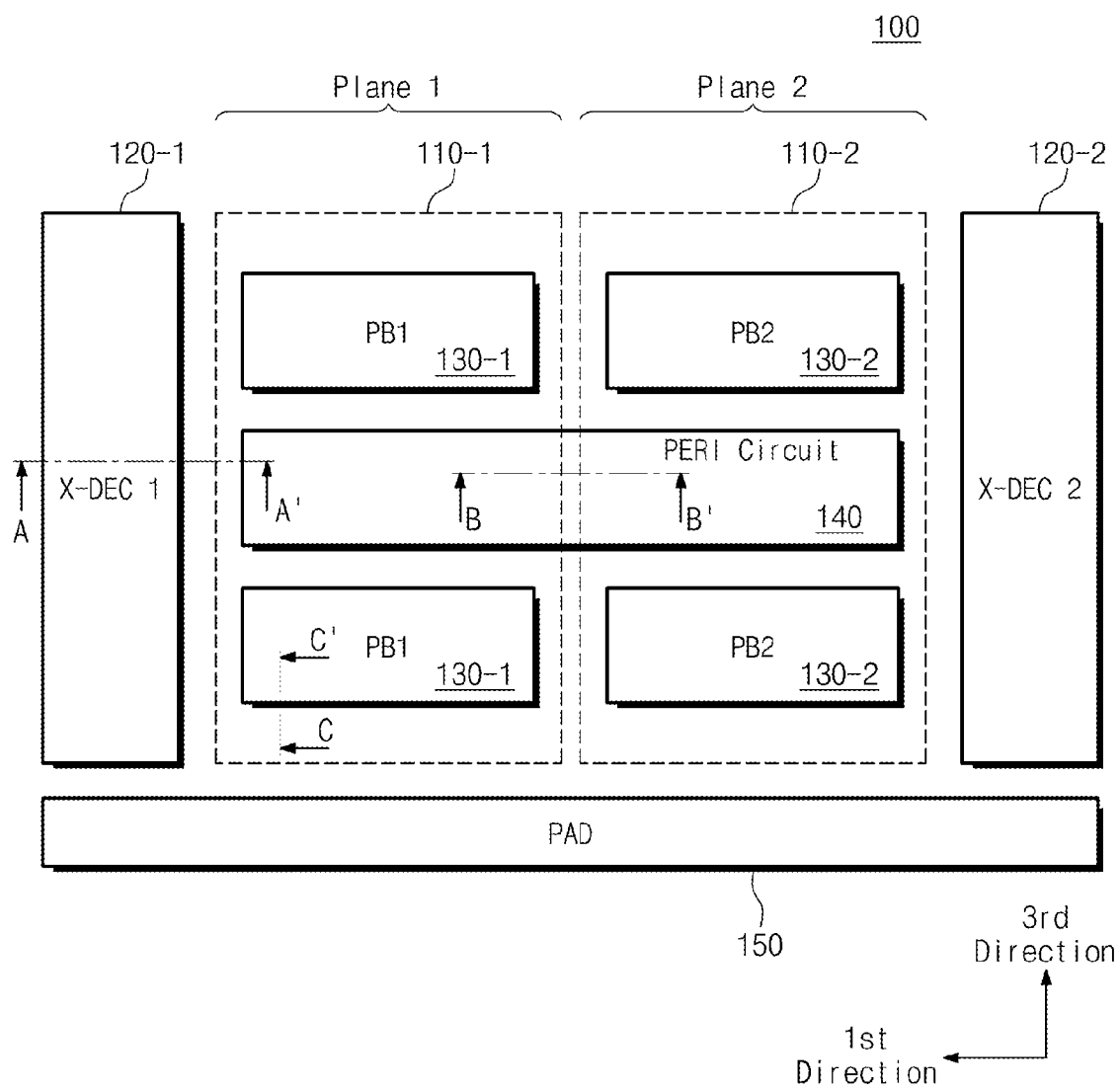
FIG. 5 is a layout diagram further illustrating the nonvolatile memory device 100 of FIG. 1 according to embodiments of the inventive concept.

FIG. 5 is a layout diagram still further illustrating in a layout mode the nonvolatile memory device 100 of FIGS. 1 through 4 according to embodiments of the inventive concept. Referring to the FIG. 5, the first address decoder 120-1 and second address decoder 120-2 are disposed on opposite sides of the peripheral circuit 140.

Where the peripheral circuit 140 is disposed in the first direction on the substrate, the first and second page buffer circuits (130-1, 130-2) may be disposed in parallel with and on the respective sides of the peripheral circuit 140. The first address decoder 120-1 may be arranged on one side of the first page buffer circuit 130-1 in the third direction, and the second address decoder 120-2 may arranged on the side of the second page buffer circuit 130-2 in the third direction. The first address decoder 120-1 and the second address decoder 120-2 may be arranged on opposite sides of the peripheral circuit 140, and the I/O 150 may be arranged on one side of the first and second page buffer circuit (130-1, 130-2) in the first direction, where the I/O pad 150 is connected to the first and second page buffer circuits (130-1, 130-2) and peripheral circuit 140.

Figure 6:
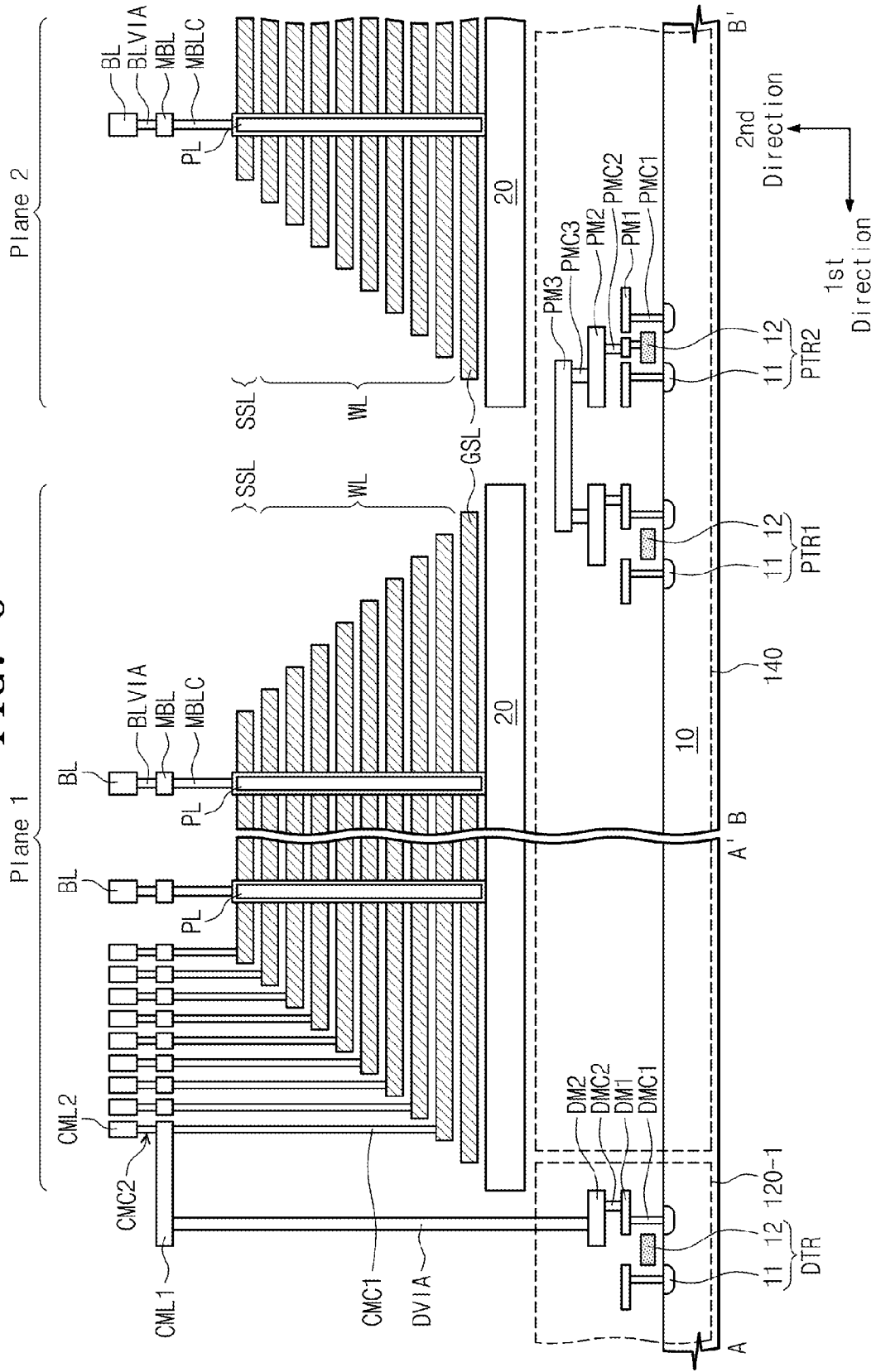
FIG. 6 is a cross-sectional diagram according to A-A' and B-B' line of FIG. 5.

FIG. 6 is a cross-sectional diagram illustrating views view taken respectively along lines A-A' and B-B' of FIG. 5. Referring to FIGS. 5 and 6, the first address decoder 120-1 and peripheral circuit 140 are disposed on a substrate 10. The first and second planes (110-1, 110-2) are disposed on the peripheral circuit 140.

The peripheral circuit 140 may be formed in the substrate 10 in the first direction, and generally includes a plurality of transistor. Each transistor may include an active region 11 doped on the substrate 10, where the active region 11 include source and drain region for each transistor, and a gate region 12, where the gate region 12 may be formed across the active region 11.

The first address decoder 120-1 may be formed beside the peripheral circuit 140 on the substrate 10 in the third direction, and also includes a similar plurality of transistors.

The semiconductor layer 20 may be formed on the peripheral circuit 140. The first and second plane (110-1, 110-2) may be stacked on the semiconductor layer 20. The ground selection line GSL, word lines WL, and the string selection line SSL may be stacked as a plate form. Pillars PL may be generated by penetrating ground selection line GSL, word lines WL, and string selection line SSL. Each pillar may be connected to a conductive line MBL via a bit line contact MBLC. The conductive line MBL may be connected to the bit line BL through a bit line via BLVIA.

The peripheral circuit 140 may include a first and a second peripheral transistor (PTR1, PTR2), where the first peripheral transistor PTR1 is disposed under the first plane 110-1, and the second peripheral transistor PTR2 is disposed under the second plane 110-2. The first peripheral transistor PTR1 may be connected to the second peripheral transistor PTR2 via at least one of peripheral conductive line and at least one of peripheral contact.

For example, the active region 11 of the first peripheral transistor PTR1 may be connected to the first peripheral conductive line PM1 via the first peripheral contact PMC1. The first peripheral conductive line PM1 may be connected to the second peripheral conductive line PM2 via the second peripheral contact PMC2. The second peripheral conductive line PM2 may be connected to the third peripheral conductive line PM3 via the peripheral contact PMC3. The gate region of second peripheral transistor PTR2 may be connected to the first peripheral conductive line PM1 via the first peripheral contact PMC1. The first peripheral conductive line PM1 may be connected to the second peripheral conductive line PM2 via the second peripheral contact PMC2. The second peripheral conductive line PM2 may be connected to the third conductive line PM3 via the third peripheral contact PMC3. Therefore, the active region 11 of first peripheral transistor PTR1 may be connected the gate region 12 of the second peripheral transistor PTR2.

However, connection of the peripheral transistors is not limited to only the foregoing. The first and second peripheral transistor PTR1, PTR2 may be connected via the first peripheral contact PMC1 and the first peripheral conductive line PM1. The first and second peripheral transistor PTR1, PTR2 may be connected via the first and second peripheral contact (PMC1, PMC2), and the first and second peripheral conductive line (PM1, PM2).

The first address decoder 120-1 may include a decoder transistor DTR. The decoder transistor DTR may be connected to a word line via at least one of decoder conductive line and at least one of decoder contact. For example, active region 11 of the decoder transistor DTR may be connect to the first decoder conductive line DM1 via the first decoder contact DMC1. The first decoder conductive line DM1 may be connected to the second decoder conductive line DM2 via the second decoder contact DMC2. The second decoder conductive line DM2 may be connected to the first cell conductive line CML1 through a decoder via DVIA. The first cell conductive line CML1 may be connected to the word line via a first cell contact CMC1. The first cell conductive line CML1 may be connected to the second cell conductive line CML2 via the second cell contact CMC2.

FIG. 6 illustrates a connection relation to the first address decoder 120-1 and the first plane 110-1, as an example. A similar connection in relation of the second address decoder 120-2 and the second plane 110-2 is not shown in FIG. 6.

Figure 7:
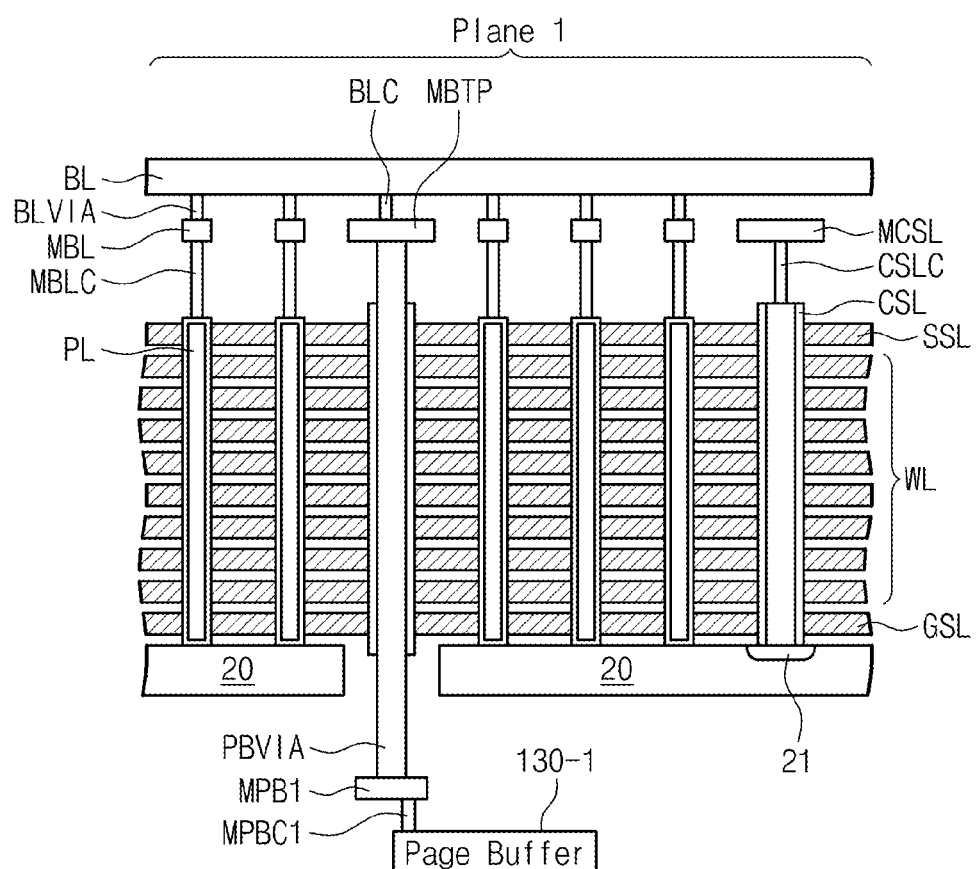
FIG. 7 is a cross-sectional diagram according to C-C' line of FIG. 5.

FIG. 7 is a cross-sectional diagram illustrating a view taken along line C-C' of FIG. 5. Referring to the FIGS. 5 and 7, the first page buffer circuit 130-1 may be disposed under the first plane 110-1.

The semiconductor layer 20 may formed upper the first page buffer circuit 130-1. The first plane 110-1 may be stacked on the first plane 110-1. The ground selection line GSL, word line WL, and string selection line SSL may be stacked as a plate form. The pillars PL may formed by penetrating the ground selection line GSL, word lines WL, and string selection line SSL. Each of the pillar may be connected to the conductive line MBL via a bit line contact MBLC. The conductive line MBL may be connected the bit line BL via the bit line via BLVIA.

The first page buffer circuit 130-2 may be formed on the substrate 10. The first page buffer circuit 130-1 may be connected to the first buffer conductive line MPB1 via the first buffer contact MPBC1. The first buffer conductive line MPB1 may be connected to a conductive line between buffer and bit line MBTP through a buffer via PBVIA. The conductive line between buffer and bit line MBTP may be connected to the bit line BL via the bit line contact BLC. The buffer via PBVIA may be formed by penetrating the ground selection line GSL, word lines WL, string selection line and the semiconductor layer 20.

An active region 21 may be doped into the semiconductor layer 20. The common source line CSL may be connected to the active region 21. The common source line CSL may be formed by penetrating the ground selection line GSL, word lines WL, and string selection line SSL. The common course line CSL may be connected to the source conductive line MCSL via a source line contact CSLS.

Figure 8:
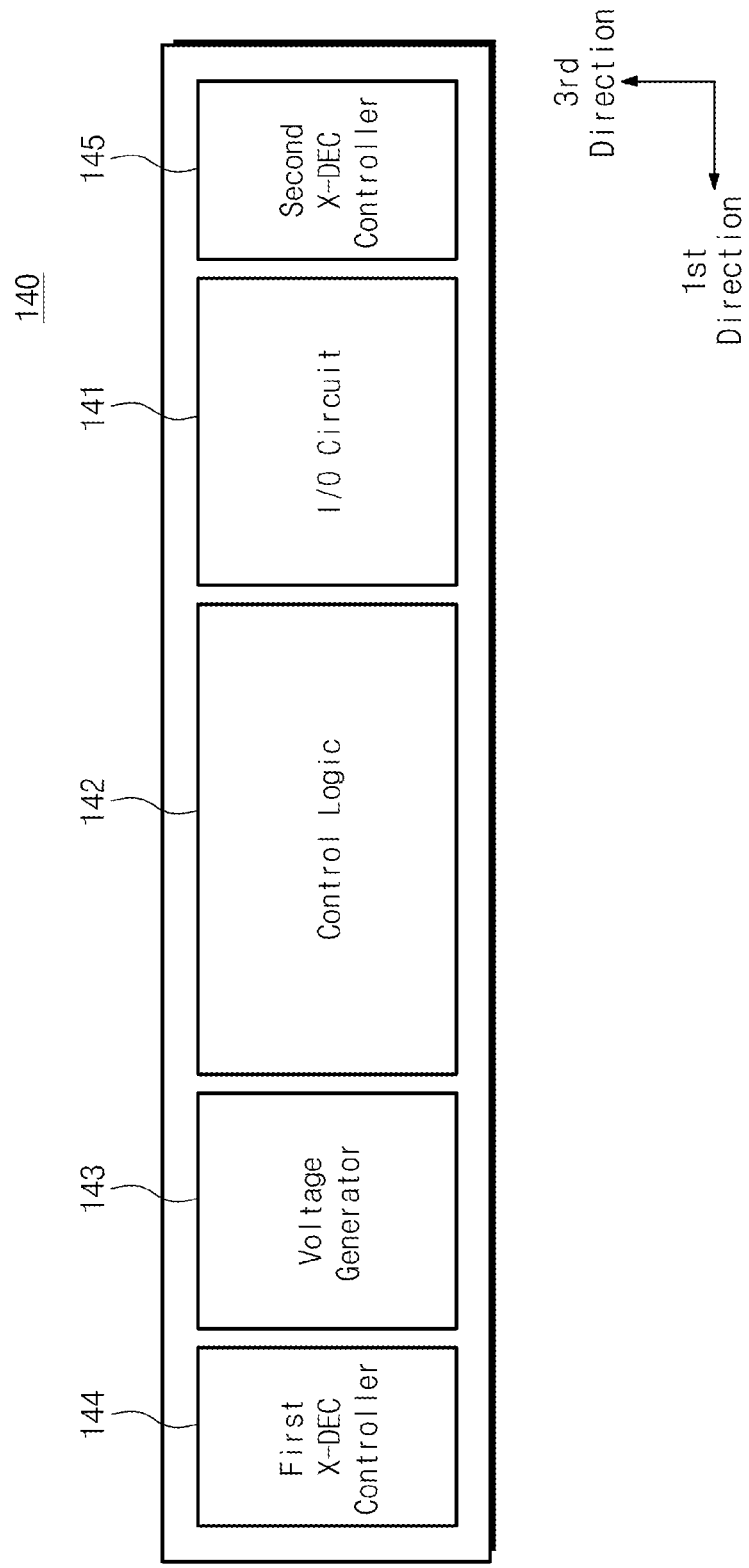
FIG. 8 is a flow plan illustrating layout of peripheral circuit of FIG. 5 according to embodiments of the inventive concept.

FIG. 8 is a layout diagram further illustrating in one example the peripheral circuit 140 of FIG. 5. Referring to FIGS. 5 and 8, the peripheral circuit 140 may include an I/O circuit 141, control logic 142, a voltage generator 143, a first decoder controller 144 and a second decoder controller 145.

The I/O circuit 141 may include a global buffer to store command CMD received from the memory controller, address ADDR and data. The first and second page buffer circuits 130-1, 130-2 may share the global buffer included in the I/O circuit 141. The I/O circuit 141 may be connected to the control logic 141 and the first and second decoder controllers 144, 145.

The control logic 142 may be connected to the first and second decoder controllers 144, 145, the voltage generator 143, and I/O circuit 141. The control logic 142 may control the overall operation of the nonvolatile memory device 100 in response to one or more commands received from an external device (e.g., a memory controller).

As previously noted, the voltage generator 143 may generate a variety of voltages required by the nonvolatile memory device 100. This may be done under the control of the control logic 142.

The first decoder controller 144 may control the first address decoder 130-1 in response to an address ADDR received from the I/O circuit 141, and similarly the second decoder controller 145 may control the second address decoder 130-2 in response to an address ADDR received from the I/O circuit 141.

In FIG. 8, the first and second decoder controllers 144, 145 may be arranged both on respective sides of the peripheral circuit 140. The I/O circuit 141 may be arranged adjacent to the second decoder controller 145. The voltage generator 143 may be arranged adjacent to the first decoder controller 144. The control logic 142 may be arranged between the I/O circuit 141 and the voltage generator 143. However, the layout of peripheral circuit 140 is not limited thereto.

Figure 9:
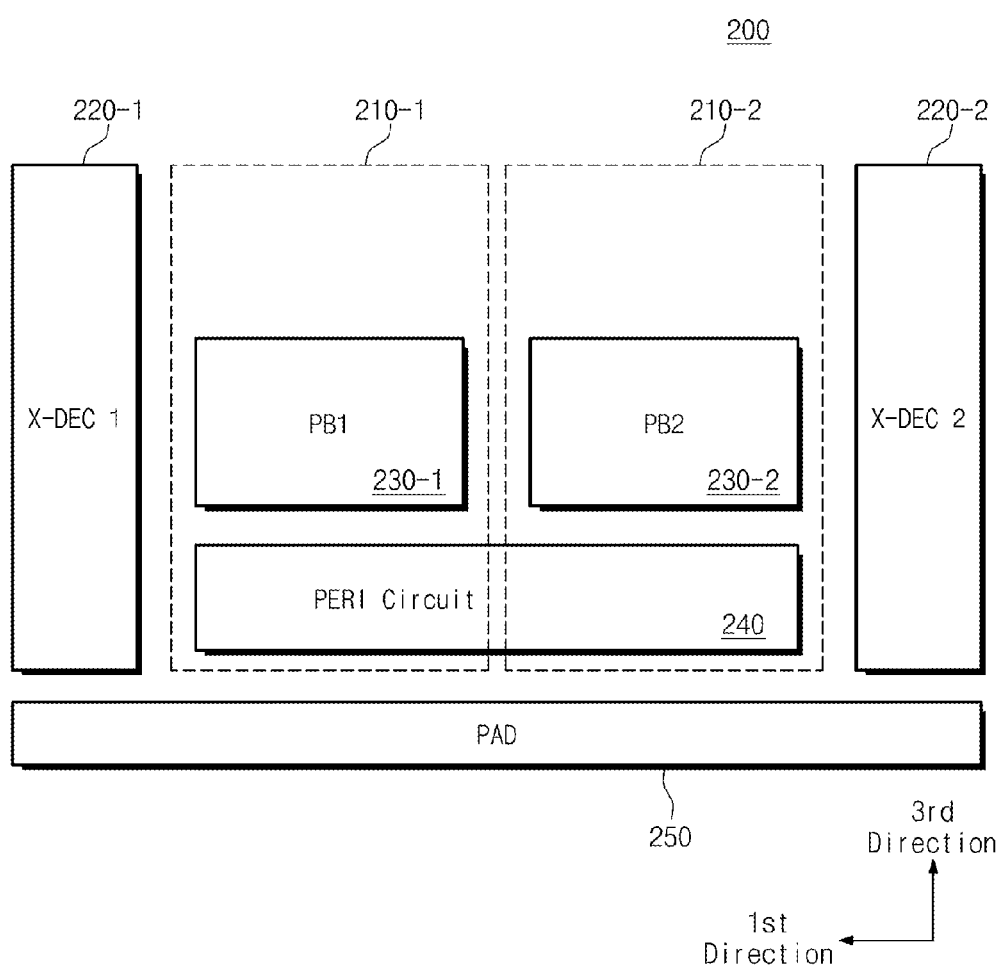
FIG. 9 is a layout diagram illustrating a nonvolatile memory device according to embodiments of the inventive concept.

FIG. 9 is another layout diagram illustrating a memory device according to embodiments of the inventive concept. Referring to FIG. 9, the first and second planes 210-1, 210-2 may be arranged adjacent to each other. The peripheral circuit 240 may be disposed under the first and second plane 210-1, 210-2. The peripheral circuit 240 may be arranged in the first direction according to a surface substantially orthogonal to a surface adjacent to the first and second plane 210-1, 210-2. The first and second page buffer circuit 230-1, 230-2 may be arranged adjacent to the peripheral circuit 240. The first page buffer circuit 230-1 may be disposed under the first plane 210-1, and the second page buffer circuit 230-2 may be disposed under the second plane 210-2. The first address decoder 220-1 may be arranged adjacent to the first page buffer circuit 230-1 in the third direction, and the second address decoder 220-2 may be arranged adjacent to the second page buffer circuit 230-2 in the third direction. The I/O pad maybe arranged in the first direction adjacent to the peripheral circuit 240.

Figure 10:
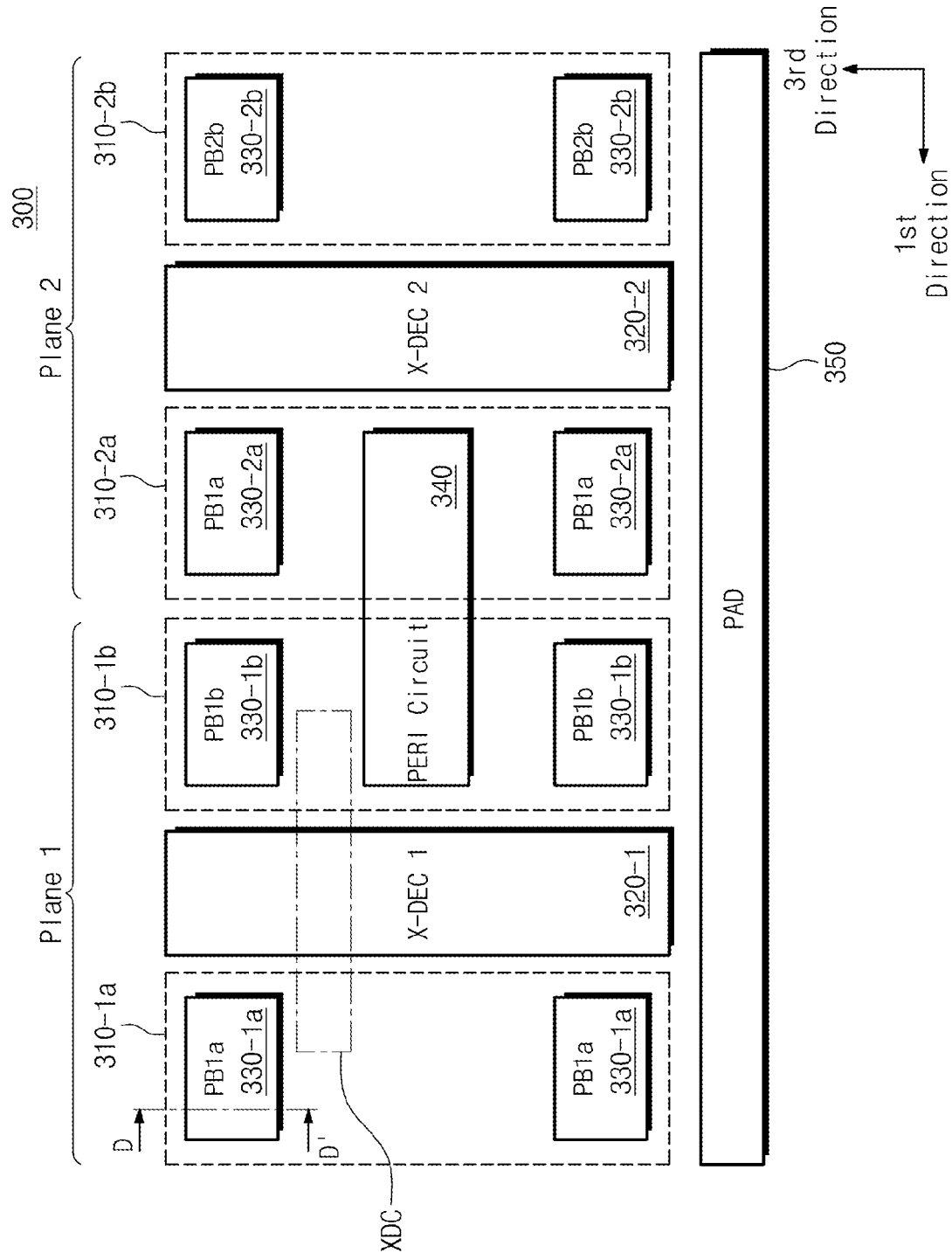
FIG. 10 is a layout diagram illustrating a nonvolatile memory device according to embodiments of the inventive concepts.

FIG. 10 is a layout diagram illustrating a nonvolatile memory device according to embodiments of the inventive concepts. Referring to FIG. 10, the first address decoder 320-1 may disposed at a center of the first plane 310-1. The second address decoder 320-2 may disposed at a center of the second plane 310-2. In FIG. 10, the first and second planes 310-1, 310-2 may be stacked on the peripheral circuit 340 such as FIG. 5. Therefore, COP structure may be embodied.

The first plane 310-1 may include the sub-planes 310-1a, 310-1b. The first address decoder 320-1 may be arranged between the sub-planes 310-1a, 310-1b. The second plane 310-2 may include sub-planes 310-2a, 310-2b. The second address decoder 320-2 may be arranged between the sub-planes 310-2a, 310-2b.

The peripheral circuit 340 may be arranged under the sub-plane 310-1b of the first plane 310-1 and the sub-plane 310-2a of the second plane 310-2. The peripheral circuit 340 may be formed in the first direction between the first and second address decoder 320-1, 320-2.

The first page buffer circuit 330-1 may include sub-page buffer circuits 330-1a and 330-1b. The sub-page buffer circuit 330-1a may be disposed under the sub-plane 310-1a, and the sub-page buffer circuit 330-1b may be disposed under the sub-plane 310-1b. The sub-page buffer circuits 330-1a, 330-1b may be arranged on each side of and in a line of the sub-planes 310-1a, 310-1b. The sub-page buffer circuits 330-1a and 330-1b may be arranged in two parts, with the peripheral circuit 340 being arranged between the two parts of the sub-page buffer circuit 330-1b.

The second page buffer circuit 330-2 may include sub-page buffer circuits 330-2a and 330-2b. The sub-page buffer circuit 330-2a may be disposed under the sub-plane 310-2a. The sub-page buffer circuit 330-2b may be disposed under the sub-plane 310-2b. The sub-page buffer circuits 330-2a and 330-2b may be arranged side by side on each side of the sub-planes 310-2a and 310-2b. Here again, the sub-page buffer circuits 330-2a and 330-2b may be arranged in two parts with the peripheral circuit 340 being arranged between two parts of the sub-page buffer circuit 330-2a.

Figure 11:
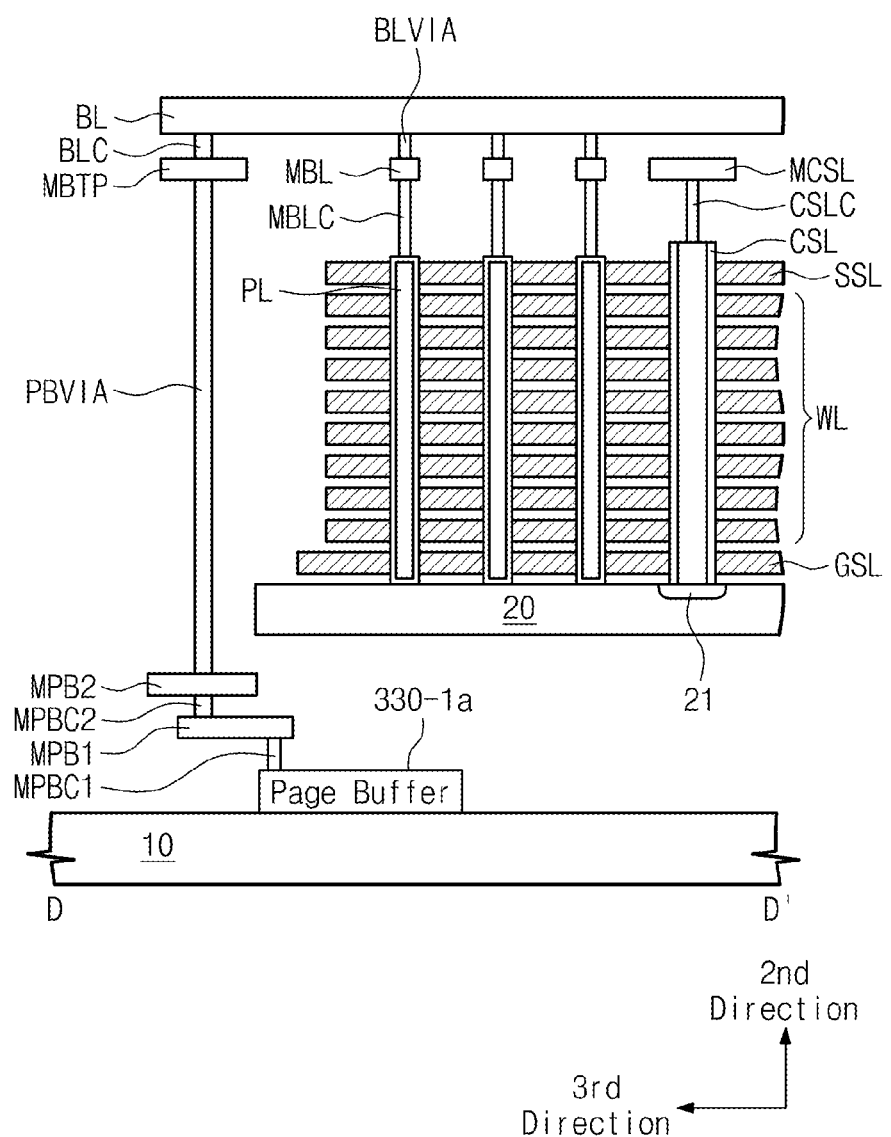
FIG. 11 is a cross-sectional diagram according to D-D' line of FIG. 10.

FIG. 11 is a cross-sectional diagram illustrating a view taken along the line D-D' in FIG. 10. Referring to FIGS. 10 and 11, sub-page buffer circuit 330-1a may disposed under the sub-plane 310-1a.

The semiconductor layer 20 may be formed above the sub-page buffer circuit 330-1a. The sub-plane 310-1a may be stacked on the semiconductor layer 20. The ground selection line GSL, word lines WL and string selection line SSL may be stacked as a plate form. The pillar PL may be generated by penetrating the ground selection line GSL, word lines WL, and string selection line SSL. Each pillar may be connected to the conductive line MBL via the bit line contact MBLC. The conductive line MBL may be connected to the bit line through bit line via BLVIA The sub-page buffer circuit 330-1a may be formed on the substrate 10. The sub-page buffer circuit 330-1a may be connected to the first buffer conductive line MPB1 via the first buffer contact MPBC1. The first buffer conductive line MPB1 may be connected to the second buffer conductive line MPB2 via the second buffer contact MPBC2. The second buffer conductive line MPB2 may be connected to the buffer-bit line conductive line MBTP through the buffer via PBVIA. The buffer-bit line conductive line MBTP may be connected to the bit line BL via the bit line contact BLC.

An active region 21 may be doped on the semiconductor layer 20. The common source line CSL may be connected to the active region 21. The common source line CSL may be formed by penetrating the ground selection line GSL, word lines WL, and string selection line SSL. The common source line CSL may be connected to the source conductive line MCSL via a source line contact CSLS.

Figure 12:
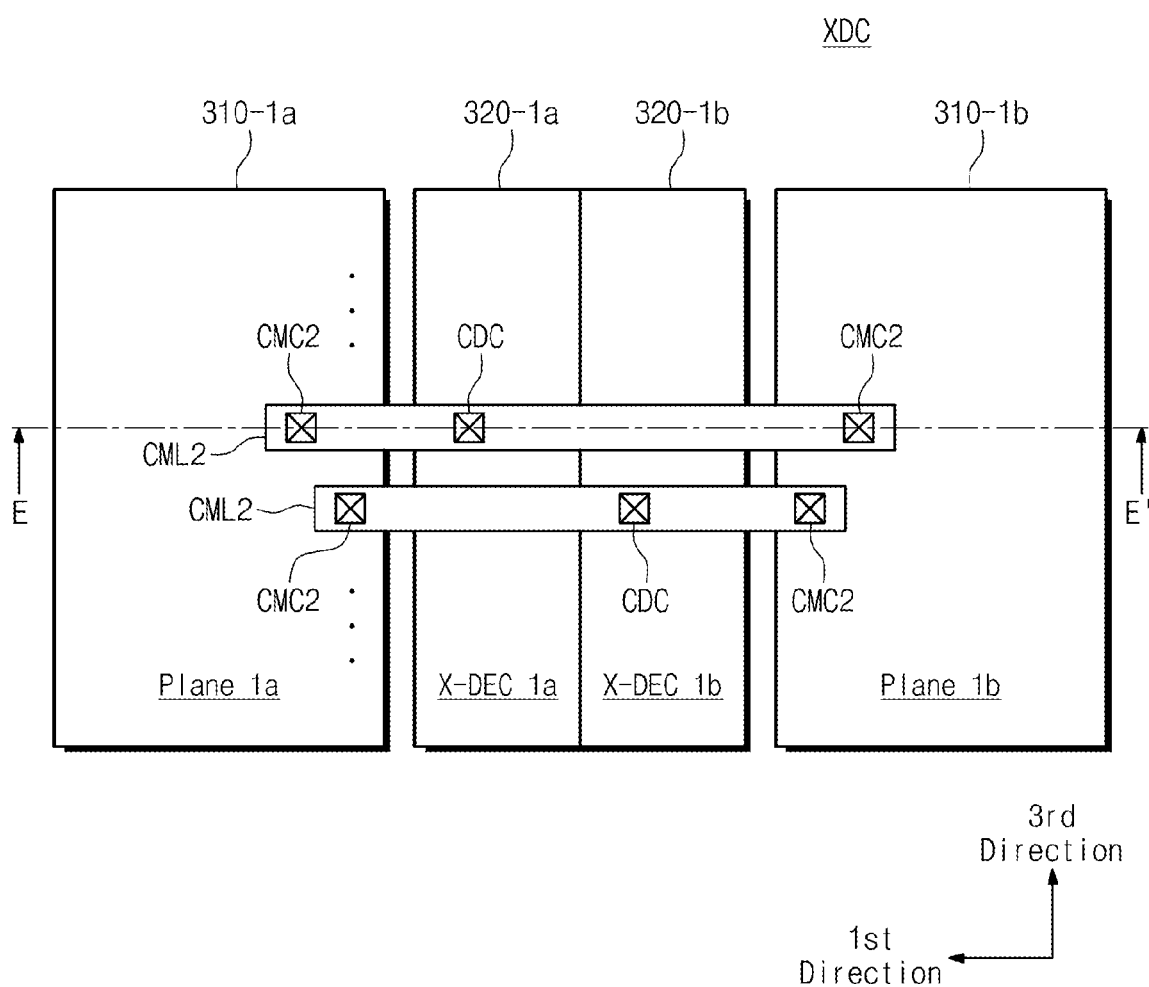
FIG. 12 is an enlarged diagram illustrating decoder connection part (XDC) of FIG. 10.
Figure 13:
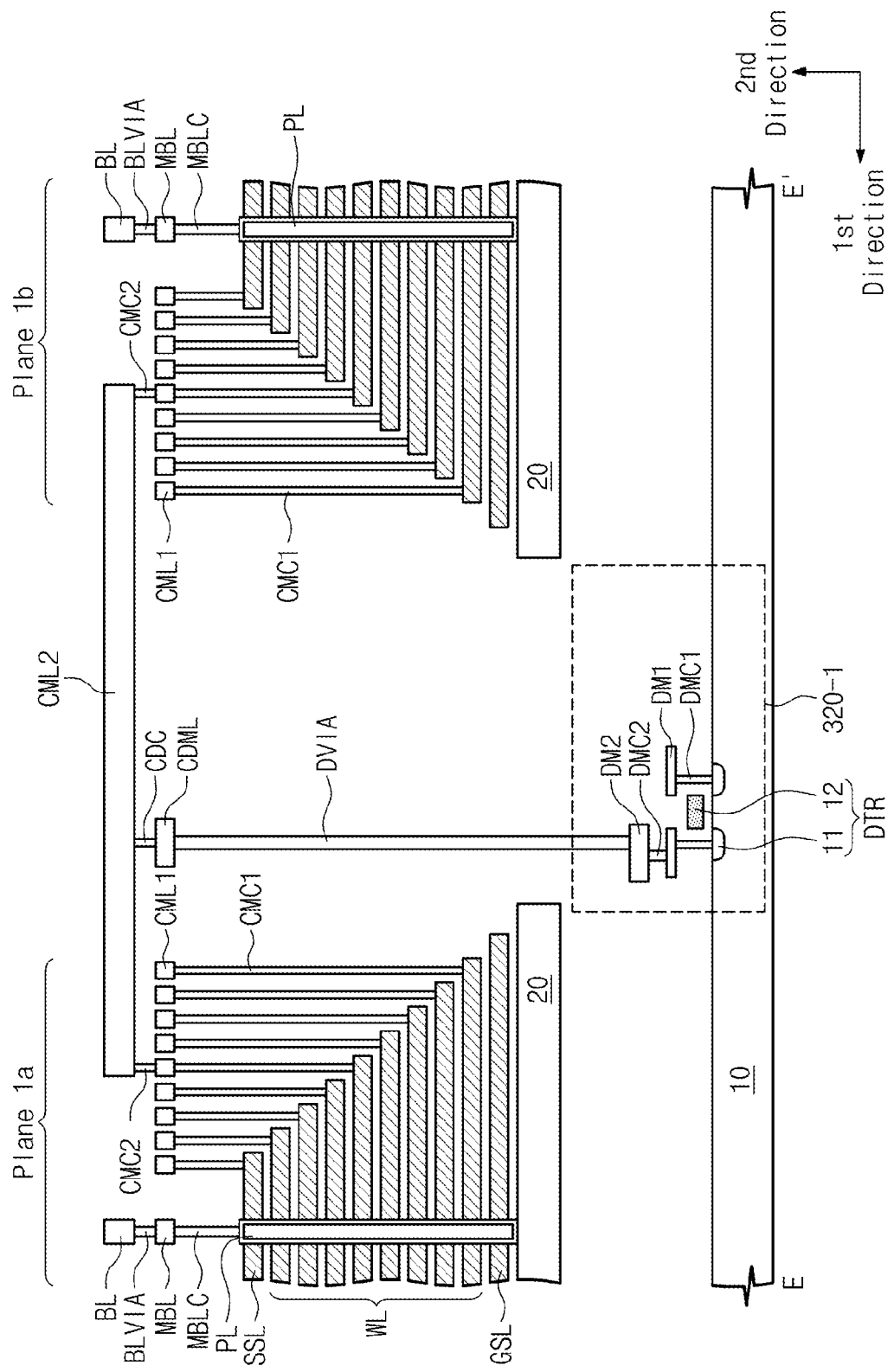
FIG. 13 is a cross-sectional diagram according to E-E' line of FIG. 12.

FIG. 12 is a block diagram further illustrating in one embodiment the decoder connection part (XDC) of FIG. 10. FIG. 13 is a cross-sectional diagram illustrating a view taken along line E-E of FIG. 12.

Referring to FIGS. 10, 12 and 13, the first address decoder 310-1 may include sub-decoders 310-1a and 310-1b, where the second cell conductive line CML2 is connected to the sub-planes 310-1a and 310-1b via the second cell contact CMC2. The second cell conductive line CML2 may be connected to the cell-decoder conductive line CDML via a cell-decoder contact CDC. The cell-decoder conductive line CDML may be connected to one of the sub-decoders 320-1a and 320-2b through the decoder via DVIA.

The first address decoder 320-1 may be disposed between the sub-planes (310-1a, 310-1b) on the substrate in the third direction. The first address decoder 320-1 may include a plurality of transistor. Each of the transistor may include the active region 11 doped on the substrate 10. The active region 11 may include a source region or drain region of each transistor. The each transistor may include the gate region 12. The gate region 12 may be formed across the active region 11 included in each transistor.

The semiconductor layer 20 may be formed at a position apart a height of the first address decoder 320-1 from the substrate 10. The sub-planes 310-1a and 310-1b may be stacked on the substrate layer 20. In each one of the sub-planes 310-1a and 310-1b, ground selection line GSL, word lines WLs, and string selection line SSL may be stacked one on top of the respective other to provide a stacked plate-like configuration. The pillars may be formed by penetrating the ground selection line GSL, word lines WLs, and string selection line SSL. Each of the pillars may be connected to the conductive line MBL via the bit line contact MBLC. The conductive line MBL may be connected to the bit line BL through the bit line via BLVIA.

The first address decoder 320-1 may include the decoder transistor DTR. The decoder transistor DTR may be connected to the word line via at least one of the decoder conductive line and at least one of the decoder contact. For example, the active region 11 of the decoder transistor DTR may be connected to the first decoder conductive line DM1 via the first decoder contact DMC1. The first decoder conductive line DM1 may be connected to the second decoder conductive line DM2 via the second decoder contact DMC2. The second decoder conductive line DM2 may be connected to the cell-decoder conductive line CDML through the decoder via DVIA. The cell-decoder conductive line CDML may be connected to the second cell conductive line CML2 via the cell-decoder contact CDC. The second cell conductive line CML2 may be connected to the first cell conductive line CML1 via the second cell contact CMC2. The first cell conductive line CML1 may be connected to the word line WL via the first cell contact CMC1.

FIG. 13 is a cross-sectional view further illustrating a connection in relation to the first address decoder 320-1 and first plane 310-1. A similar connection relation may exist between the second address decoder 320-2 and second plane 310-2.

Figure 14:
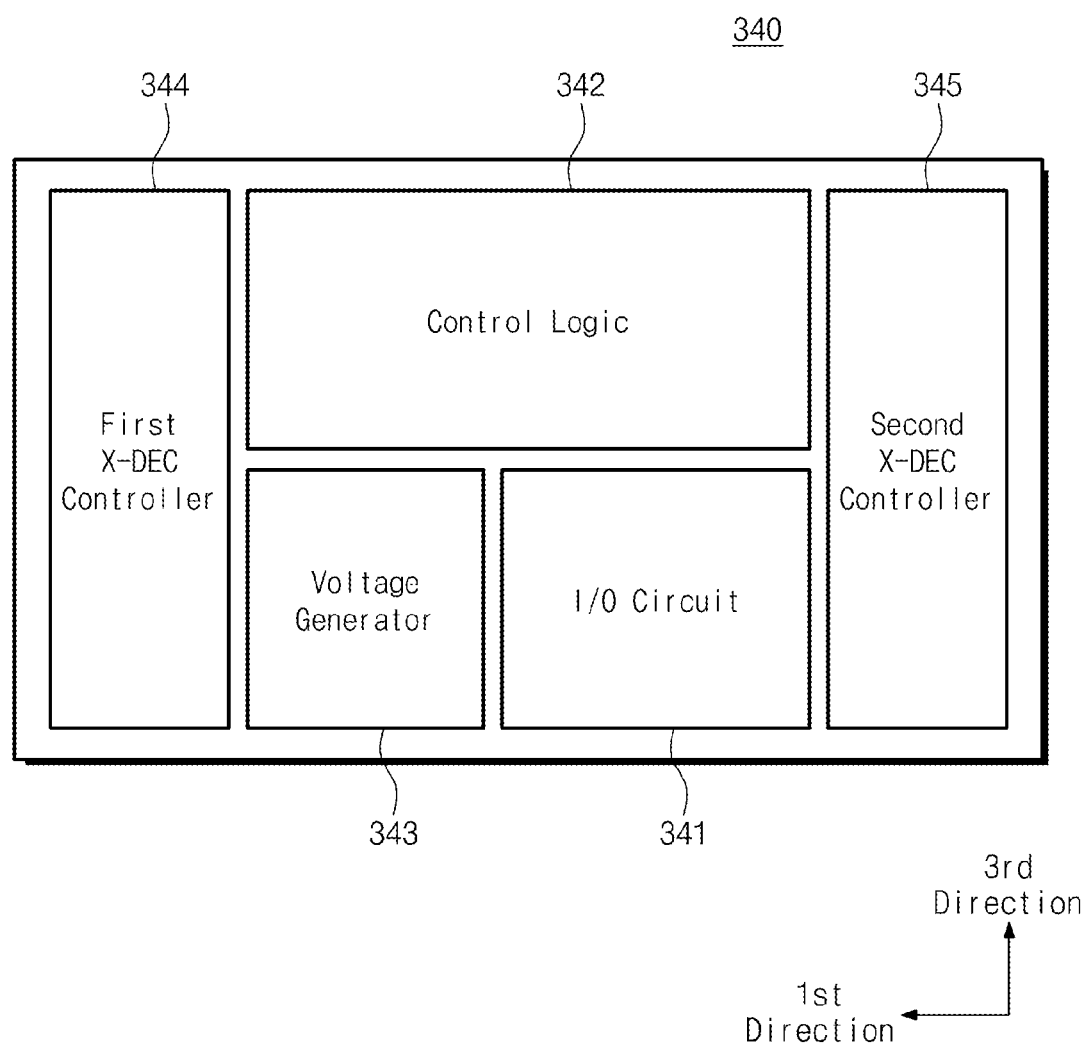
FIG. 14 is a layout diagram further illustrating the peripheral circuit 340 of FIG. 10 according to embodiments of the inventive concept.

FIG. 14 is a layout diagram further illustrating the peripheral circuit 340 of FIG. 10 according to embodiments of the inventive concept. Referring to FIGS. 10 and 14, the peripheral circuit 340 includes an I/O circuit 341, control logic 342, a voltage generator 343, a first decoder controller 344 and a second decoder controller 345.

The I/O circuit 341 may include a global buffer to store temporarily received command CMD, address ADDR and data DATA from the memory controller. The first and second page buffer circuits 330-1 and 330-2 may share at least one of global buffer included in the I/O circuit 341. The I/O circuit 341 may be connected to the control logic 341 and the first and second decoder controller 344, 345.

The control logic 342 may be connected to the first and second decoder controllers 344 and 345, voltage generator 343, and I/O circuit 341. The control logic 342 may control the overall operation of the nonvolatile memory device 300 in response to one or more commands CMD received from an external device (e.g., a memory controller).

As before, the voltage generator 343 may be used to generate a variety of voltages required by the nonvolatile memory device 300 under the control of the control logic 342.

The first decoder controller 344 may control the first address decoder 330-1 according to the control of the control logic 342. The first decoder controller 344 may receive address ADDR from the I/O circuit 341, and transmit the received address to the first address decoder 330-1. The second decoder controller 345 may control the second address decoder 330-2 according to the control of the control logic 342. The second decoder controller 345 may receive address ADDR from the I/O circuit 341, and transmit the address ADDR to the second address decoder 330-2.

In FIG. 14, the first decoder controller 344 and second decoder controller 345 may be arranged on each side of the peripheral circuit 340. The I/O circuit 341 may be arranged adjacent to the second decoder controller 345, and the voltage generator 343 may be arranged adjacent to the first decoder controller 344. The control logic 342 may be arranged adjacent to the I/O circuit 341 and the voltage generator 343. The control logic 342 may be arranged between the first and second decoder controllers 344, 345. However, layout of the peripheral circuit 340 is not limited hereto.

Figure 15:
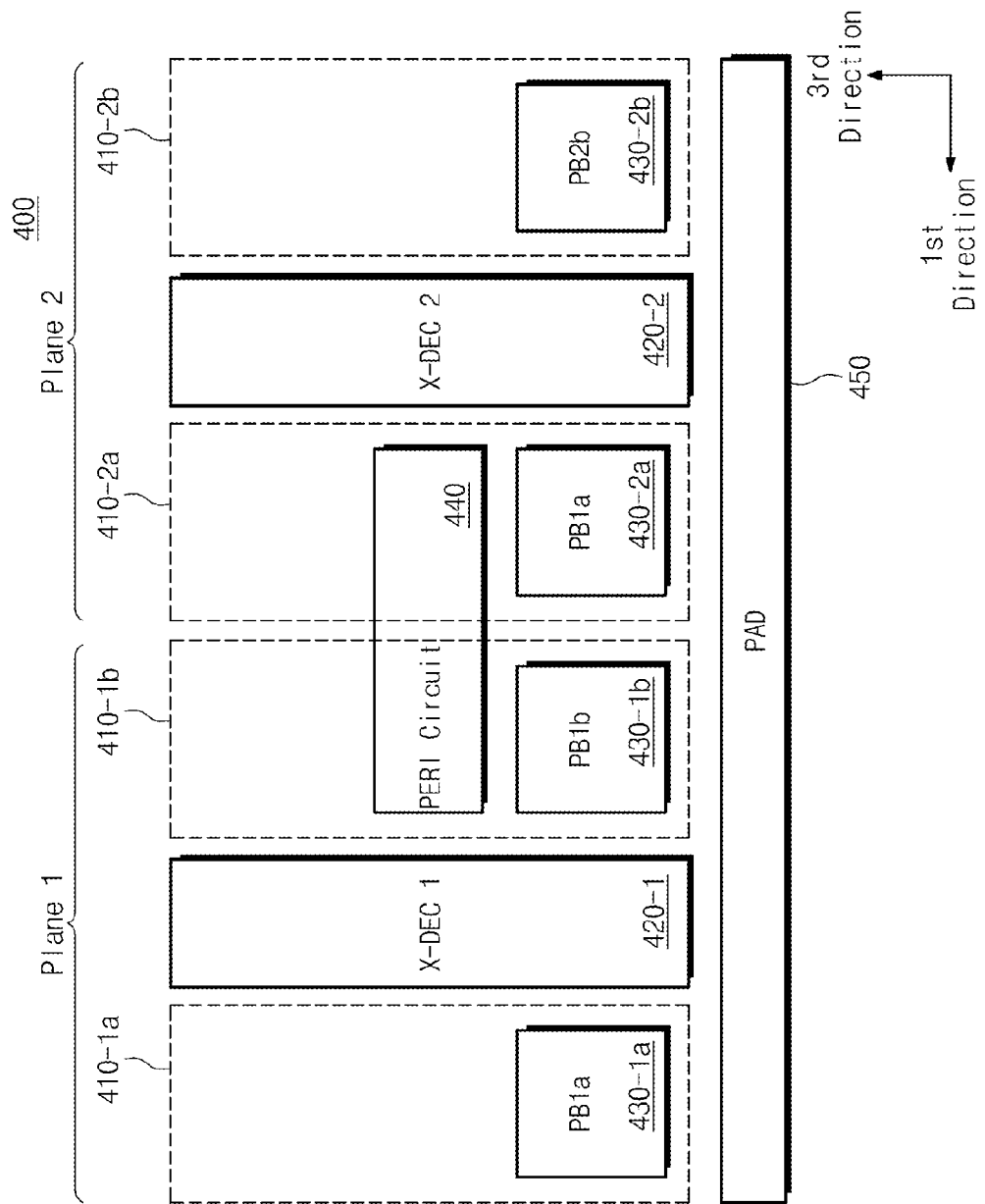
FIG. 15 is a layout diagram illustrating a nonvolatile memory device according to embodiments of the inventive concept.

FIG. 15 is a layout diagram illustrating a nonvolatile memory device according to embodiments of the inventive concept. Referring to FIG. 15, a first address decoder 420-1 may be disposed at a center of a first plane 410-1, and the second address decoder 420-2 may disposed at a center of a second plane 410-2. In FIG. 15, the first and second planes 410-1 and 410-2 are assumed to be configured in a COP structure by being stacked on the peripheral circuit 440.

The first plane 410-1 may include sub-planes 410-1a and 410-1b, where the first address decoder 420-1 may be arranged between the sub-planes 410-1a and 410-1b. The second plane 410-2 may include sub-planes 410-2a and 410-2b, where the second address decoder 420-2 may be arranged between the sub-planes 410-2a and 410-2b.

The peripheral circuit 440 may be arranged under the sub-plane 410-1b of the first plane 410-1 and the sub-plane 410-2a of the second plane 410-2. The peripheral circuit 440 may be disposed between the first and second address decoder 420-1, 420-2 in the first direction.

The first page buffer circuit 430-1 may include sub-page buffer circuits 430-1a, 430-1b. The sub-page buffer circuit 430-1a may be disposed under the sub-plane 410-1a. The sub-page buffer circuit 430-1b may be disposed under the sub-plane 410-1b. The sub-page buffer circuits 430-1a, 430-1b may be arranged in a line with one side of the sub-planes 410-1a, 410-1b. The peripheral circuit 440 may be arranged adjacent to the sub-page buffer circuit 330-1b.

The second page buffer circuit 430-2 may include sub-page buffer circuits 430-2a, 430-2b. The sub-page buffer circuit 430-2a may be disposed under the sub-plane 410-2a. The sub-page buffer circuit 430-2b may be disposed under the sub-plane 420-2b. The sub-page buffer circuits 430-2a, 430-2b may be arranged in a line with one side of the sub-planes 410-2a, 410-2b. The peripheral circuit 440 may be arranged adjacent to the sub-page buffer circuit 430-2a.

Figure 16:
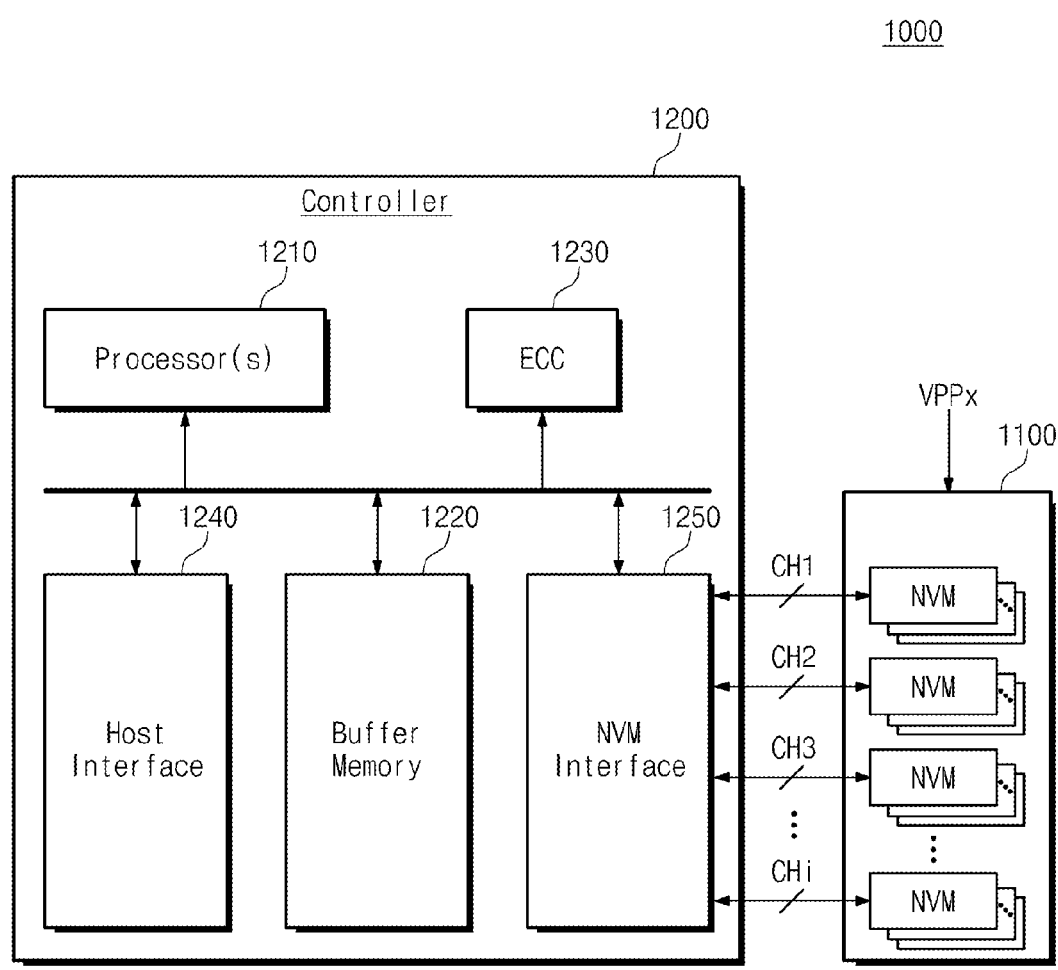
FIG. 16 is a block diagram illustrating a SSD according to embodiments of the inventive concept.

FIG. 16 is a block diagram illustrating a SSD 1000 that may include one or more memory devices according to certain embodiments of the inventive concept. Referring to FIG. 16, the SSD 1000 includes a plurality of nonvolatile memory devices 1100 and SSD controller 1200.

The nonvolatile memory devices 1100 may be embodied optionally supplied external high voltage (Vpp). Each of the nonvolatile memory devices 1100 may include the multi-plane of COP structure described in FIG. 1 through FIG. 15. Each of the nonvolatile memory devices 1100 may arrange the address decoder corresponding to each of the planes on one side of the plane. Therefore, each of the nonvolatile memory devices 1100 may connect peripheral circuits corresponding each of the planes via lines disposed under the planes.

The SSD controller 1200 may be connected to the nonvolatile memory devices 1100 via a plurality of channels (CH1~Chi, where 'i' is an integer greater than 1). The SSD controller 1200 may include at least one processor 1210, a buffer memory 1220, error correction circuit (ECC) 1230, a host interface 1250, and a nonvolatile memory interface 1260.

The buffer memory 1220 may temporally store data for an operation of the memory controller 1200. The buffer memory 1220 may include a plurality of memory lines to store data or command.

The error correction circuit 1230 may calculate an error correction code of data to be programmed in a write operation. The error correction circuit 1230 may correct error based on the error correction code value. The error correction circuit 1230 may correct errors of data restored from the nonvolatile memory device 1100 in data restoring operation. The error correction circuit 1230 may include a code memory (not shown) to store necessity code data to operate the memory controller 1200. The code memory may be embodied as nonvolatile memory device.

The host interface 1240 may interface with one or more external devices. The host interface 1240 may be a NAND flash interface. The host interface 1240 may be embodied in manner of various interface. The host interface 1240 may be embodied a plurality of interfaces. The nonvolatile memory interface 1250 may offer an interface function with the nonvolatile memory device 1100.

In various embodiments, the inventive concept may be applied to various embedded multimedia cards (eMMC) such as the moviNAND and iNAND.

Figure 17:
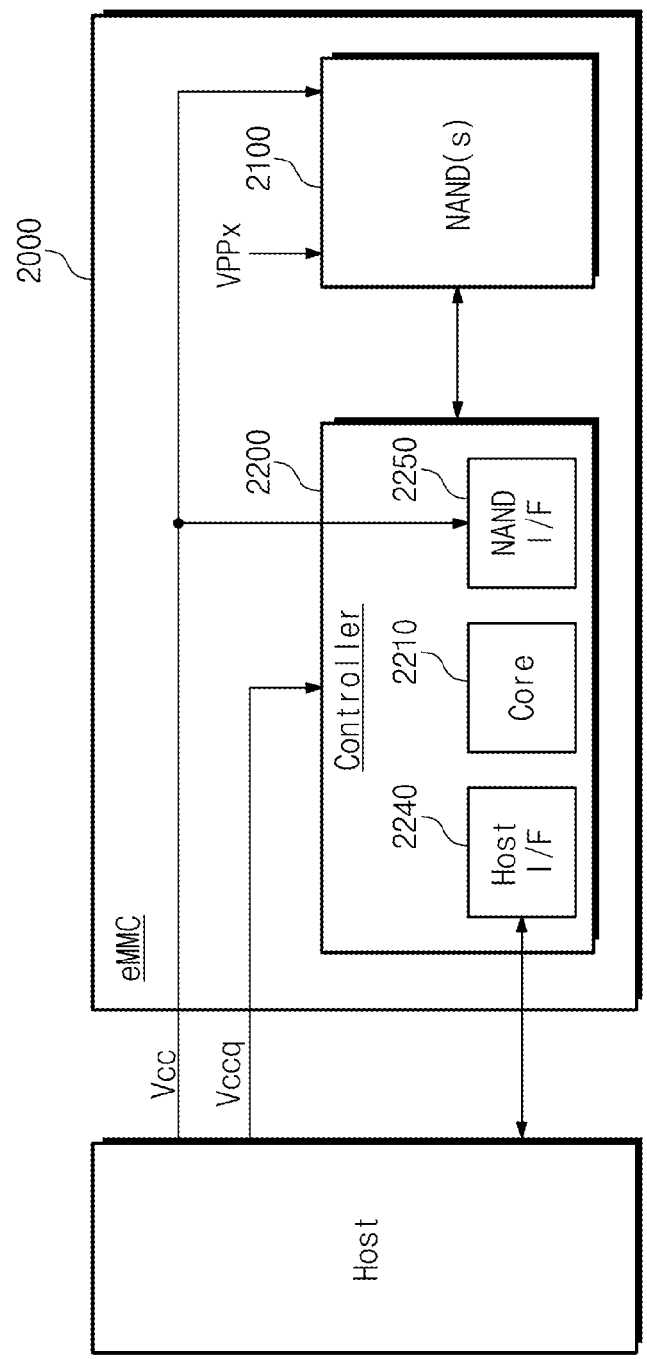
FIG. 17 is a block diagram illustrating an eMMC according to embodiments of the inventive concept.

FIG. 17 is a block diagram illustrating in one example an eMMC according to embodiments of inventive concept. Referring to FIG. 17, the eMMC 2000 may include at least one NAND flash memory device 2100 and a controller 2000.

The NAND flash memory device 2100 may be embodied as single data rate (SDR) NAND or double data rate (DDR) NAND. The NAND flash memory device 2100 may be embodied as vertical NAND (VNAND). The NAND flash memory device 2100 may include multi-plane as described in FIG. 1 through FIG. 15. The NAND flash memory device 2100 may arrange the address decoder. The NAND flash memory device 2100 may arrange the address decoder corresponding to each of the planes on one side of the plane. Therefore, the NAND flash memory device 2100 may connect peripheral circuits corresponding each of the planes via lines disposed under the planes corresponding to each of the planes on one side of the plane. Therefore, the NAND flash memory device 2100 may connect peripheral circuits corresponding each of the planes via lines disposed under the planes.

The controller 2200 may be connected to the NANA flash memory device 2100 via a plurality of channels. The controller 2200 may control at least one controller core 2210, a host interface 2240, and NAND interface 2250. The at least one controller core 2210 may control overall operations of the eMMC 2000. The host interface 2240 may execute interfacing with the controller 2210 and the host. The NAND interface 2250 may execute interfacing with the NAND flash memory device 2100 and the controller 2200. In certain embodiments of inventive concept, the host interface 2240 may be parallel interface (e.g., an MMC interface). In other embodiments of inventive concept, the host interface 2240 of the eMMC 2000 may be series interface (for example, UHS-II, UFS interface). In still other embodiments of the inventive concept, the host interface 2240 may be NANA interface.

The eMMC 2000 may receive source voltages (Vcc, Vccq) from the host. Herein, the first source voltage (Vcc, e.g., 3.3V) is provided to the NANA flash device 2100 and NAND interface 22500. The second source voltage (Vccq, for example, 1.8V/3.3V) is provided to the controller 2200. In embodiments of inventive concept, the eMMC 2000 may optionally receive external high voltage (Vpp).

Figure 18:
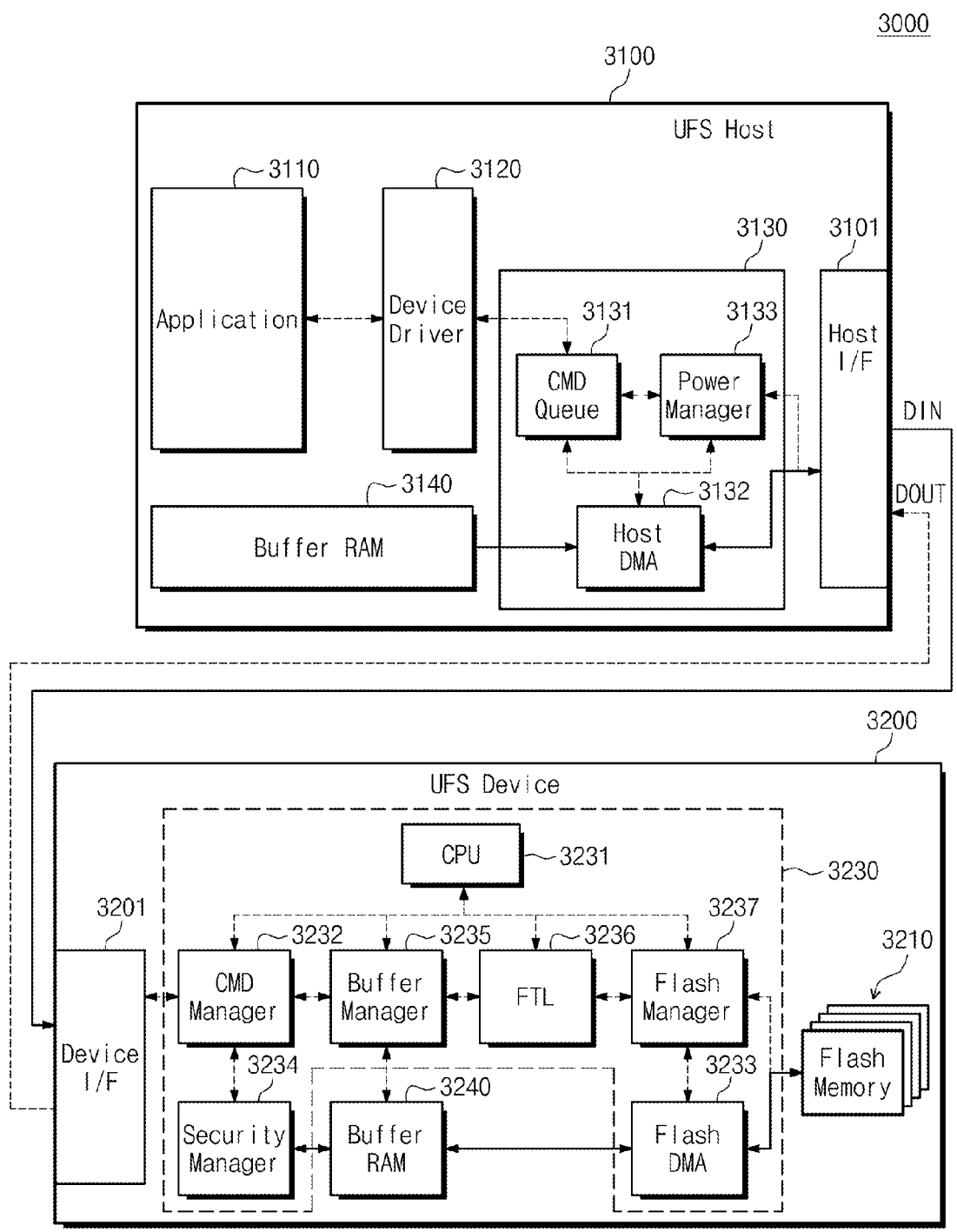
FIG. 18 is a block diagram illustrating an UFS system according to embodiments of the inventive concept.

The inventive concept may be applied to various embodiments recognized as Universal Flash Storage (UFS) devices and/or systems. FIG. 18 is a block diagram illustrating a USF system according to the embodiments of inventive concept. Referring to FIG. 18, the UFS system 3000 may include a UFS host 3100 and a UFS device 3200.

The UFS host 3100 may include a application 3110, a device driver 3120, a host controller 3130, and buffer RAM 3140. The host controller 3130 may include a command queue 3131, an host DMA 3132, and a voltage manager 3133. The command queue 3131, the host DMA 3132, and the voltage manager 3133 may be operate as an algorithm, software, and/or firmware in the host controller 3130.

A command generated in the application 3110 and the device driver 3120 of the UFS host 3100 (for example, write command) may transmitted to the command queue 3131 of the host controller 3130. The command queue 3131 may store sequentially a command to provide the UFS device 3200. The command stored in the command queue 3131 may be transmitted to the host DMA 3132. The host DMA 3132 may transmit the command to the UFS device 3200 via the host interface 3101.

The UFS device 3200 may include a flash memory 3210, a device controller 3230, and a buffer RAM 3240. The device controller 3230 may include CPU 3231, a command manager 3232, a flash DMA 3233, a security manager 3234, a buffer manager 3235, a flash translation layer (FTL) 3236, and a flash manager 3237. The command manager 3232, the security manager 3234, the buffer manager 3235, the FTL 3236, and flash manager 3237 may be operate as algorithm, software, and/or firmware in the device controller 3230.

The flash memory 3210 may include multi-plane of COP structure as described in FIGS. 1 through 15. The flash memory devices 3210 may arrange the address decoder corresponding to each of the planes on one side of the plane. Therefore, the flash memory devices 3210 may connect peripheral circuits corresponding each of the planes via lines disposed under the planes.

A received command from the UFS host 3100 to the UFS device 3200 may be transmitted to the command manager 3232. The command manager 3232 may analyze the received command from the UFS host 3100, certify the received command using the security manager 3234. The command manager 3232 may arrange the buffer RAM 3240 to receive data via the buffer manager 3235. The command manager 3232 may output ready-to-transfer (RTT) UPIP to the UFS host when data transmission preparation is ready.

The UFS host 3100 may transmit data to the UFS device 3200 in response to the RTT UPIP. The data may be transmitted to the UFS device 3200 via the host DMA 3132 and the host interface 3101. The UFS device 3200 may store the received data to the buffer RAM 3240 via the buffer manager 3235. The data stored in the buffer RAM 3240 may be transmitted to the flash manager 3237 via the flash DMA 3233. The flash manager 3237 may store data to a selected address of the flash memory 3210 by reference to an address mapping information of the FTL 3236.

When data transmission required to the command and program are completed, the UFS device 3200 may transmit a response to the UFS host 3100 via an interface, and notice a command completion. The UFS host 3100 may notice whether an operation of the command received the response is completed to the device driver 3129 and the application 3110, and complete the operation regarding the command.

Figure 19:
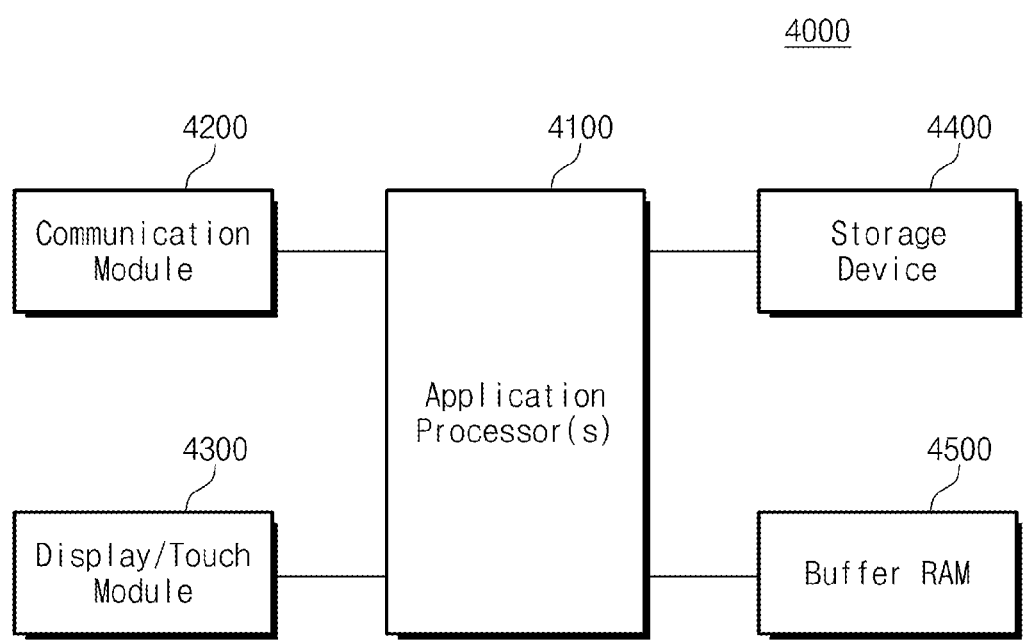
FIG. 19 is a block diagram illustrating a mobile device according to embodiments of the inventive concept.

The inventive concept may be applied to mobile devices. FIG. 19 is a block diagram illustrating a mobile device according to embodiments of the inventive concept. Referring to FIG. 19, the mobile device 4000 may include an application processor 4100, a communication module 4200, a display/touch module 4300, and a storage device 4400 and a mobile RAM 4500.

The application processor 4100 may control overall operations of the mobile device 4000. The communication module 4200 may be embodied to control external wired/wireless communication. The display/touch module 4300 may display data processed at application processor 4100. The display/touch module 4300 may receive data from the touch panel. The storage device 4400 may store user data. The store device 4400 may be a eMMC, SSD, UFS device. The mobile RAM 4500 may store data required in mobile device 4000 operations.

The storage device 4400 may include one or more multi-plane or COP structures as described in FIGS. 1 through 15. The storage device 4400 may arrange the address decoder corresponding to each of the planes on one side of the plane. Therefore, each of the nonvolatile memory devices 1100 may connect peripheral circuits corresponding each of the planes via lines disposed under the planes.

The memory system or storage device according to embodiments of the inventive concept may be mounted using various package form. In embodiments of the inventive concept, the memory system or storage device may be mounted using PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), etc.

The above-disclosed subject matter is to be considered illustrative in nature, and the scope of the following claims extends over many modifications and enhancements that will become apparent to those of ordinary skill in the art upon consideration of the foregoing. Thus, to the maximum extent allowed by law, the scope of the claims shall be determined by the broadest permissible interpretation, and shall not be restricted or limited to only the foregoing illustrated embodiments.

What is claimed is:

1. A nonvolatile memory device comprising:
    a first plane disposed on a first semiconductor layer and including first cell strings formed in a first direction orthogonal to the first semiconductor layer;
    a second plane disposed on a second semiconductor layer and including second cell strings formed in the first direction;
    a first address decoder configured to supply first operation voltages to the first plane;
    a second address decoder configured to supply second operation voltages to the second plane;
    a first peripheral circuit disposed between a substrate and the first semiconductor layer and configured to control the first address decoder; and
    a second peripheral circuit disposed between the substrate and the second semiconductor layer and configured to control the second address decoder,
    wherein the first peripheral circuit and second peripheral circuit are connected via a peripheral conductive layer disposed under the first semiconductor layer and second semiconductor layer.

2. The nonvolatile memory device of claim 1, further comprising:
a first page buffer circuit configured to program data to the first cell strings and read data from the first cell strings;
a second page buffer circuit configured to program data to the second cell strings and read data from the second cell strings,
wherein the first page buffer circuit is arranged adjacent to the first peripheral circuit on the substrate and the second page buffer circuit is arranged adjacent to the second peripheral circuit on the substrate.

3. The nonvolatile memory device of claim 2, wherein the first page buffer circuit is connected to a first page buffer line disposed under the semiconductor layer via a first page buffer contact, and to first bit lines connected to the first cell strings through a page buffer via penetrating the semiconductor layer.

4. The nonvolatile memory device of claim 3, wherein the first page buffer line is connect to a second page buffer line disposed under the semiconductor layer via a second page buffer contact, and to the first bit lines through the page buffer via.

5. The nonvolatile memory device of claim 2, wherein the first page buffer circuit is disposed under the first plane, and the second page buffer circuit is disposed under the second plane.

6. The nonvolatile memory device of claim 2, wherein the first page buffer circuit comprises a first sub-buffer group and a second sub-buffer group, and the first peripheral circuit is disposed between the first sub-buffer group and the second sub-buffer group.

7. The nonvolatile memory device of claim 1, further comprising:
a first page buffer circuit configured to program data to the first cell strings and read data from the first cell strings;
a second page buffer circuit configured to program data to the second cell strings and read data from the second cell strings,
the first page buffer circuit is disposed under the first plane, adjacent to a longitudinal section of the first plane, and connected to the first cell strings via first bit lines,
the second page buffer circuit is disposed under the second plane, adjacent to a longitudinal section of the second plane, and connected to the second cell strings via second bit lines.

8. The nonvolatile memory device of claim 1, wherein the first plane and the second plane are disposed adjacent to each other,
the first address decoder is arranged around the first plane on a side opposite to that of the second plane, and
the second address decoder is arranged around the second plane on a side opposite to that of the first plane.

9. The nonvolatile memory device of claim 8, further comprising:
an Input/Output (I/O) pad disposed along an orthogonal surface adjacent to a surface of at least one of the first plane and second plane, wherein the I/O pad is configured to transmit and receive at least one of a command and an address from an external device.

10. The nonvolatile memory device of claim 1, wherein the first peripheral circuit comprises a first decoder controller that controls the first address decoder, and the second peripheral circuit comprises a second decoder controller that controls the second address decoder.

11. The nonvolatile memory device of claim 10, wherein the first decoder controller is disposed adjacent to the first address decoder, and the second decoder controller is disposed adjacent to the second address decoder.

12. The nonvolatile memory device of claim 1, wherein each one of the first peripheral circuit and the second peripheral circuit comprises:
a voltage generator that generates the first operation voltages and second operation voltages and provides the first and second operation voltages to the first address decoder and second address decoder; and
control logic configured to control the voltage generator, the first address decoder and second address decoder.

13. The nonvolatile memory device of claim 12, wherein each one the first peripheral circuit and second peripheral circuit comprise:
an Input/Output (I/O) circuit configured to receive a command, an address, and write data from the an external device, transmit the command to the control logic, transmit the address to the first address decoder and the second address decoder according to a control of the control logic, and transmit the write data to a first page buffer and a second page buffer connected respectively to the first plane and the second plane via a plurality of bit lines.

14. The nonvolatile memory device of claim 13, wherein the first page buffer circuit and second page buffer circuit are respectively configured to read data from the first plane and second plane under control of the control logic, and
the I/O circuit is further configured to transmit a data read respectively from the first plane and second plane.

15. The nonvolatile memory device of claim 14, wherein the control logic is disposed between the voltage generator and the I/O circuit.

16. The nonvolatile memory device of claim 14, wherein the voltage generator and the I/O circuit are disposed adjacent to each other, and
the control logic is arranged adjacent to an orthogonal surface adjacent to the voltage generator and the I/O circuit.

17. The nonvolatile memory device of claim 1, wherein the peripheral conductive layer comprises:
a first peripheral conductive line connected to an active region disposed on the substrate via a first peripheral contact;
a second peripheral conductive line connected to the first peripheral conductive line via a second peripheral contact;
a third peripheral conductive line connected to the second peripheral conductive line via a third peripheral contact,
wherein the first peripheral circuit and second peripheral circuit are connected each other via the third peripheral conductive line.

18. The nonvolatile memory device of claim 17, wherein the active region includes at least one transistor included in the first peripheral circuit connected to a gate region of at least one transistor included in the second peripheral circuit via at least one of the first contact, second contact, third contact, first peripheral conductive line, second peripheral conductive line and third peripheral conductive line.

19. The nonvolatile memory device of claim 1, wherein the first address decoder is connected to the first cell strings via first word lines, the second address decoder is connected the second cell strings via second word lines, and
each of the first word lines and second word lines is connected to the a decoder conductive layer disposed on at least one of the first address decoder and second address decoder through a decoder via.

20. The nonvolatile memory device of claim 19, wherein the decoder conductive layer comprises:
a first decoder conductive line connected to an active region disposed on the substrate via a first decoder contact;
a second decoder conductive line connected to the first decoder conductive line via a second decoder contact,
wherein the second decoder conductive line is connected to each of the first word lines and second word lines through the decoder via.

21. A nonvolatile memory device comprising:
a first plane including first cell strings disposed on a first semiconductor layer in a first direction orthogonal to the first semiconductor layer and including first and second substring group dividing the first cell strings;
a second plane including second cell strings disposed on a second semiconductor layer in the first direction and including third and fourth substring groups dividing the second cell strings;
a first address decoder disposed between the first substring group and second substring group and configured to provide first operation voltages to the first plane;
a second address decoder disposed between the third substring group and forth substring group and configured to provide second operation voltages to the second plane;
a first peripheral circuit disposed between a substrate and the first plane and configured to control the first address decoder; and
a second peripheral circuit disposed between the substrate and the second plane and configured to control the second address decoder,
the first peripheral circuit and second peripheral circuit are connected to each other via a peripheral metal layer disposed under the first semiconductor layer and second semiconductor layers.

22. The nonvolatile memory device of claim 21, wherein the second substring group is disposed adjacent to the third substring group, the first peripheral circuit is disposed under the second substring, and the second peripheral circuit is disposed under the third substring group.

23. The nonvolatile memory device of claim 21, wherein first memory cells of the first substring group and second substring group are disposed at a first height from the first semiconductor layer and are connected to a first word line, second memory cells of the first substring group and second substring group are disposed at a second height from the first semiconductor layer and are connected to a second word line, and
the first word line and second word line are connected to different transistors included in the first address decoder.

24. The nonvolatile memory device of claim 23, wherein the first word line is connected to a first sub-decoder of the first address decoder through a first decoder via, and
the second word line is connected to a second sub-decoder of the first address decoder through a second decoder via.

25. A nonvolatile memory device comprising:
a memory cell array including cell strings stacked in a direction orthogonal to a substrate and including a first substring group and a second substring group dividing the cell strings, the first substring group and the second substring group spaced apart from each other in a direction parallel to the substrate; and
an address decoder connected to memory cells of the cell strings via a plurality of word lines and configured to provide operating voltages to the memory cells,
wherein the address decoder is disposed between the first substring group and second substring group in the direction parallel to the substrate.

26. The nonvolatile memory device of claim 25, wherein first memory cells of the first substring group and second substring group are disposed at a first height from the substrate and are connected to a first word line,
second memory cells of the first substring group and second substring group are disposed at a second height from the substrate and are connected to a second word line, and
the first word line and second word line are connected to different transistors included in the address decoder.

27. The nonvolatile memory device of claim 26, wherein the first word line is connected to a first sub-decoder included in the address decoder, and the second word line is connected to a second sub-decoder included in the address decoder.

28. The nonvolatile memory device of claim 27, wherein the first word line is connected to the first sub-decoder through a first decoder via, and the second word line is connected to the second sub-decoder through a second decoder via.

* * * * *